(12) United States Patent
Chang et al.

(10) Patent No.: US 11,495,464 B2
(45) Date of Patent: Nov. 8, 2022

(54) SEMICONDUCTOR DEVICE AND METHOD

(71) Applicant: Taiwan Semiconductor Manufacturing Co., Ltd., Hsinchu (TW)

(72) Inventors: Ya-Lan Chang, Hsinchu (TW); Ting-Gang Chen, Taipei (TW); Tai-Chun Huang, Hsinchu (TW); Chi On Chui, Hsinchu (TW); Yung-Cheng Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/923,658

(22) Filed: Jul. 8, 2020

(65) Prior Publication Data

US 2022/0013364 A1    Jan. 13, 2022

(51) Int. Cl.
*H01L 21/8238*    (2006.01)
*H01L 27/092*    (2006.01)
(Continued)

(52) U.S. Cl.
CPC .... *H01L 21/28123* (2013.01); *H01L 21/0228* (2013.01); *H01L 21/02164* (2013.01); *H01L 21/02238* (2013.01); *H01L 21/02274* (2013.01); *H01L 21/31053* (2013.01); *H01L 21/76227* (2013.01); *H01L 21/823814* (2013.01);
(Continued)

(58) Field of Classification Search
CPC ..... H01L 21/823431; H01L 21/823437; H01L 21/823481; H01L 21/823828; H01L 21/823878; H01L 21/823814; H01L 27/0886; H01L 27/0924; H01L 29/66545; H01L 29/66795; H01L 21/76227
See application file for complete search history.

(56) References Cited

U.S. PATENT DOCUMENTS 10,236,213 B1   3/2019   Pandey et al.
10,516,033 B2   12/2019   Yu et al.
(Continued)

FOREIGN PATENT DOCUMENTS

DE   102018218457 A1   5/2019
DE   102018119795 A1   1/2020
(Continued)

*Primary Examiner* — Michael M Trinh
(74) *Attorney, Agent, or Firm* — Slater Matsil, LLP

(57) ABSTRACT

An embodiment includes a method including forming an opening in a cut metal gate region of a metal gate structure of a semiconductor device, conformally depositing a first dielectric layer in the opening, conformally depositing a silicon layer over the first dielectric layer, performing an oxidation process on the silicon layer to form a first silicon oxide layer, filling the opening with a second silicon oxide layer, performing a chemical mechanical polishing on the second silicon oxide layer and the first dielectric layer to form a cut metal gate plug, the chemical mechanical polishing exposing the metal gate structure of the semiconductor device, and forming a first contact to a first portion of the metal gate structure and a second contact to a second portion of the metal gate structure, the first portion and the second portion of the metal gate structure being separated by the cut metal gate plug.

20 Claims, 28 Drawing Sheets

(51) Int. Cl.

| | | |
|---|---|---|
| *H01L 29/66* | (2006.01) | |
| *H01L 29/78* | (2006.01) | |
| *H01L 21/762* | (2006.01) | |
| *H01L 21/28* | (2006.01) | |
| *H01L 21/02* | (2006.01) | |
| *H01L 21/3105* | (2006.01) | |
| *H01L 29/06* | (2006.01) | |
| *H01L 29/08* | (2006.01) | |

(52) U.S. Cl.
CPC ............ *H01L 21/823821* (2013.01); *H01L 21/823828* (2013.01); *H01L 21/823878* (2013.01); *H01L 27/0924* (2013.01); *H01L 29/0653* (2013.01); *H01L 29/0847* (2013.01); *H01L 29/66545* (2013.01); *H01L 29/66636* (2013.01); *H01L 29/66795* (2013.01); *H01L 29/7848* (2013.01); *H01L 29/7851* (2013.01)

(56) References Cited

U.S. PATENT DOCUMENTS

| | | | |
|---|---|---|---|
| 10,854,603 | B2 | 12/2020 | Hsueh et al. |
| 2008/0102613 | A1* | 5/2008 | Elers ................ H01L 29/4966 438/584 |
| 2016/0181425 | A1 | 6/2016 | Bai et al. |
| 2017/0092643 | A1* | 3/2017 | Tseng ................ H01L 21/762 |
| 2017/0186642 | A1 | 6/2017 | Kim et al. |
| 2018/0240891 | A1* | 8/2018 | Yu ................ H01L 27/0886 |
| 2018/0248030 | A1* | 8/2018 | Cheng ................ H01L 29/0649 |
| 2018/0350906 | A1* | 12/2018 | Huang ................ H01L 21/0228 |
| 2019/0148539 | A1 | 5/2019 | Yang et al. |
| 2019/0164839 | A1* | 5/2019 | Tsai ................ H01L 21/823437 |
| 2019/0305099 | A1 | 10/2019 | Jo et al. |
| 2019/0355832 | A1 | 11/2019 | Shu et al. |
| 2019/0393324 | A1* | 12/2019 | Chen ................ H01L 29/66795 |
| 2020/0006354 | A1 | 1/2020 | Wen et al. |
| 2020/0127117 | A1 | 4/2020 | Yu et al. |
| 2020/0135472 | A1 | 4/2020 | Jang et al. |
| 2020/0176259 | A1 | 6/2020 | Lee et al. |
| 2020/0350433 | A1 | 11/2020 | Ko et al. |
| 2021/0057214 | A1* | 2/2021 | Kengoyama ........ H01L 21/0228 |

FOREIGN PATENT DOCUMENTS

| | | |
|---|---|---|
| KR | 20170075854 A | 7/2017 |
| KR | 20190112910 A | 10/2019 |
| KR | 20200049439 A | 5/2020 |
| TW | 201717398 A | 5/2017 |
| TW | 201946226 A | 12/2019 |
| TW | 202002173 A | 1/2020 |

* cited by examiner

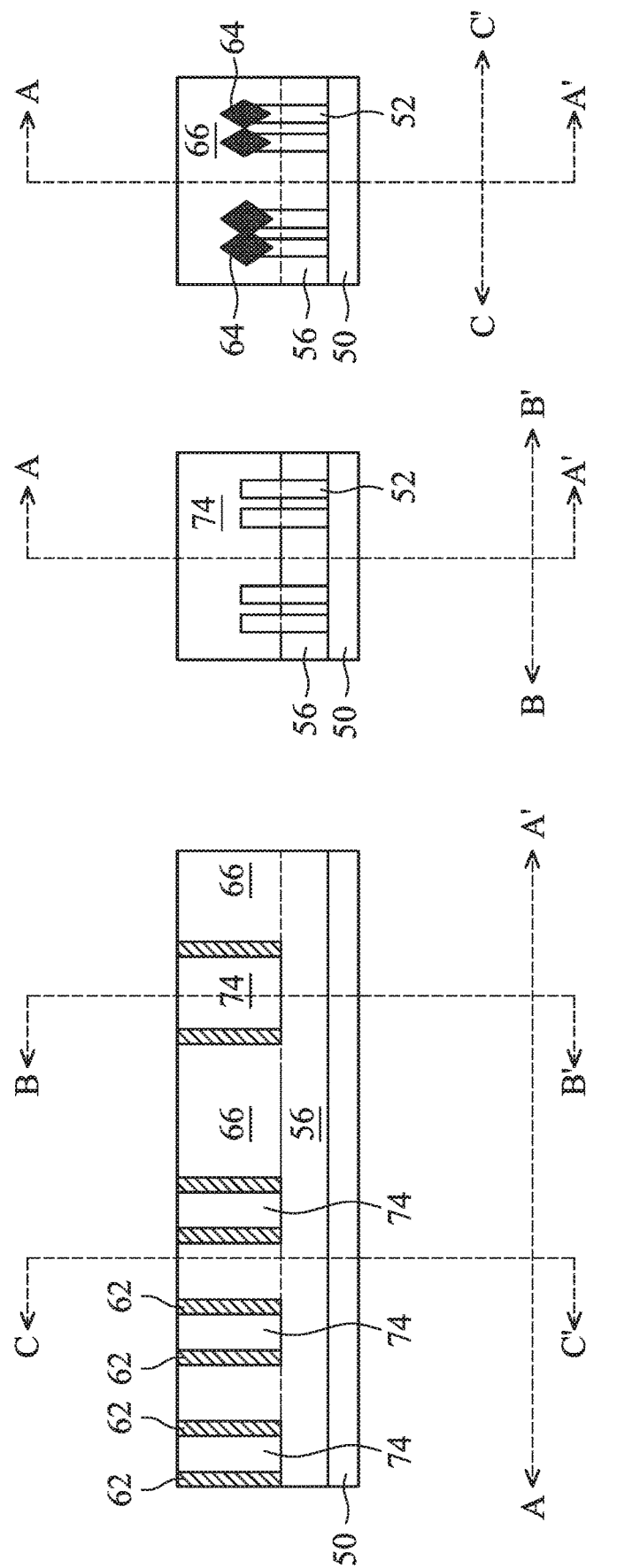

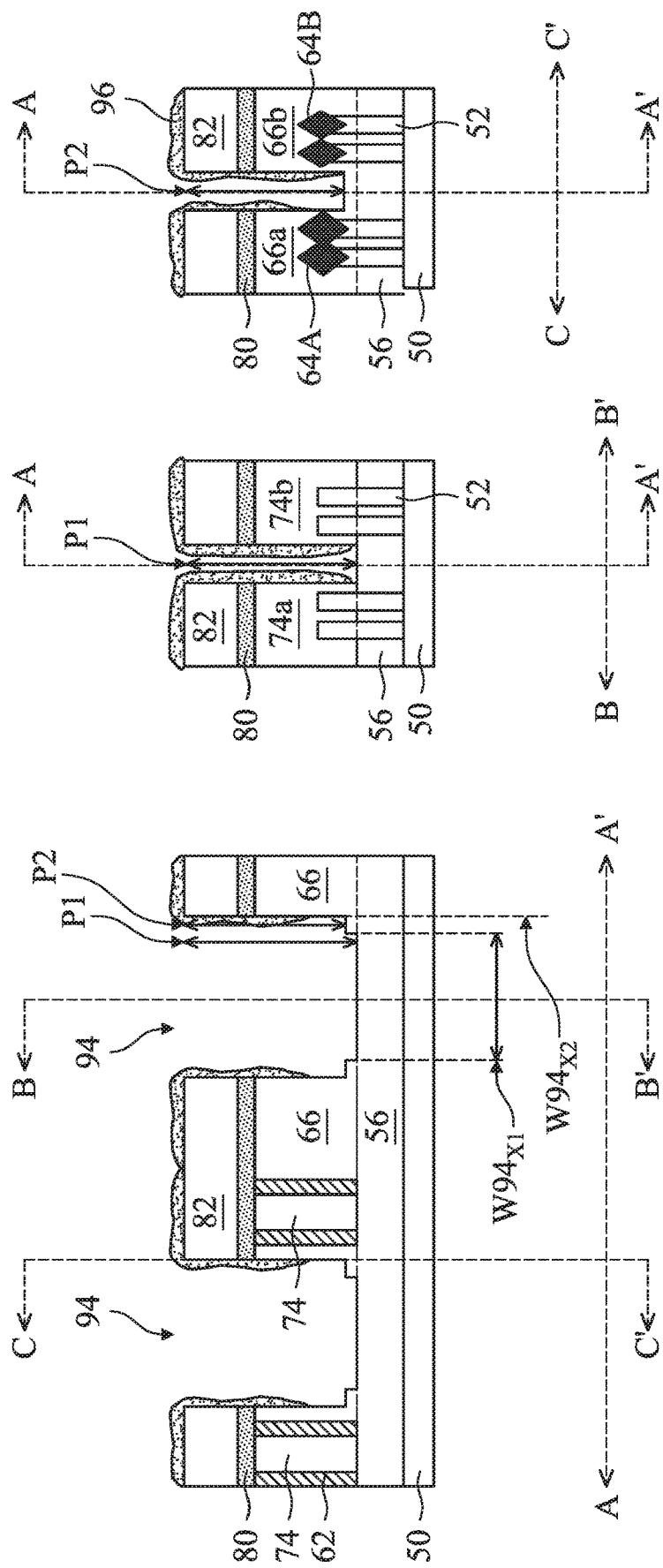

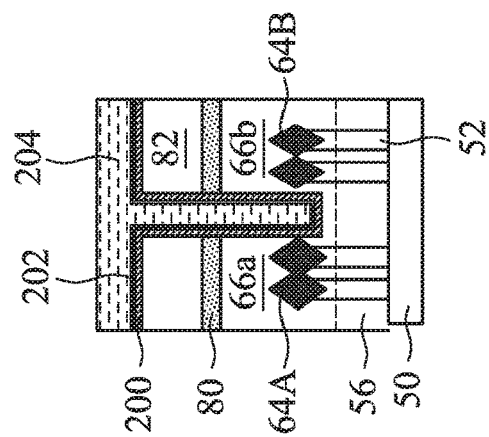
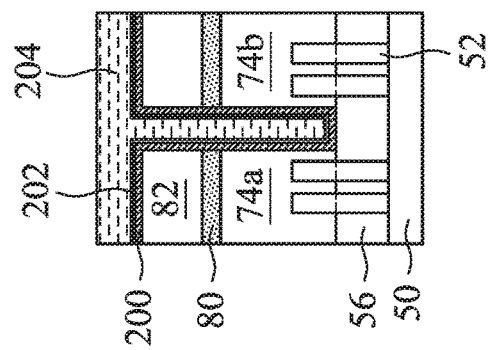
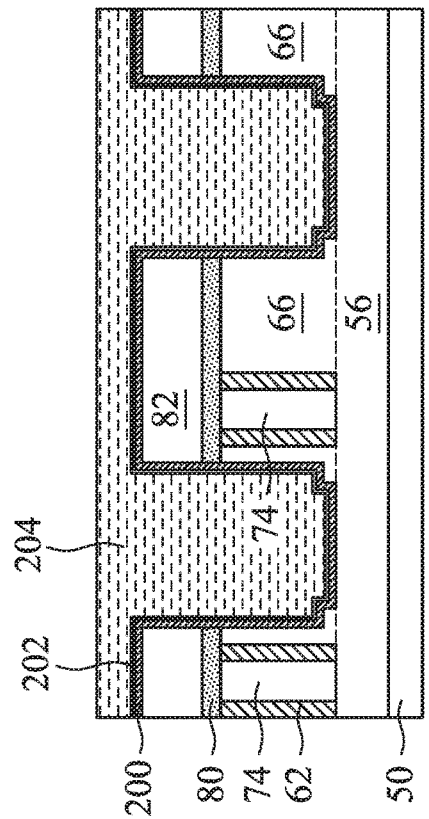
Figure 18C
Figure 18B
Figure 18A

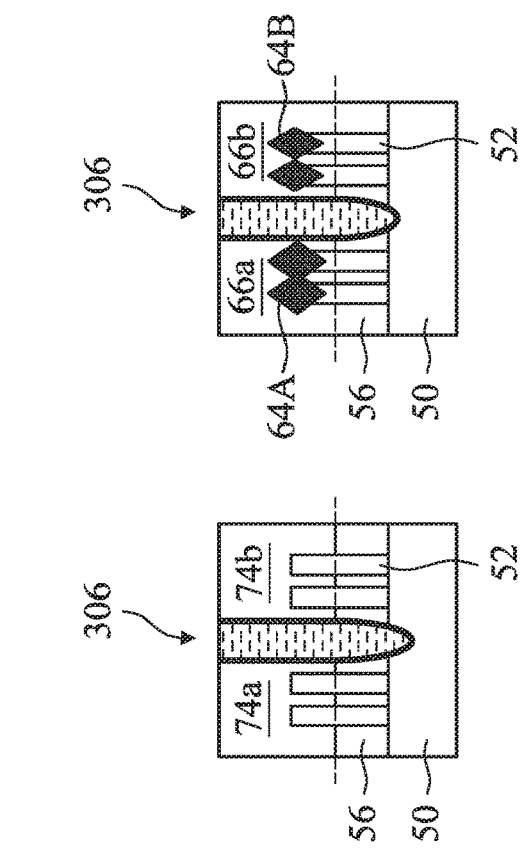
Figure 22B
Figure 22C
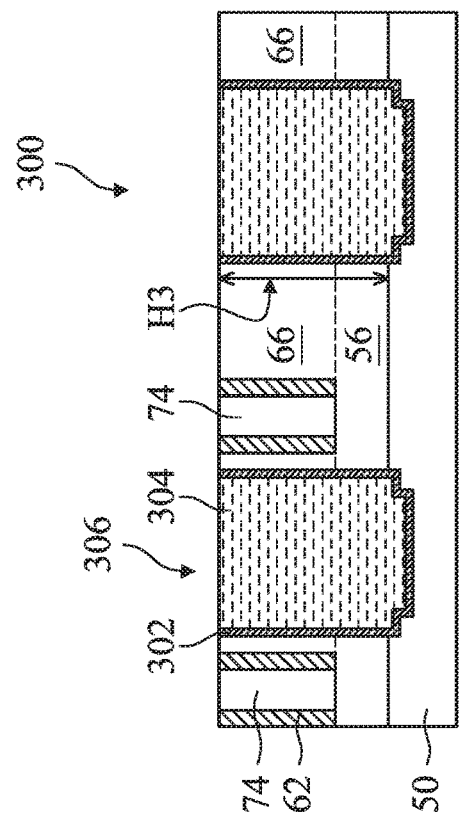
Figure 22A

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A through 16C illustrate intermediate stages in the manufacturing of FinFETs having a cut metal gate, in accordance with some embodiments.

FIGS. 17A through 19C illustrate intermediate stages in the manufacturing of FinFETs having a cut metal gate, in accordance with some other embodiments.

FIGS. 21A through 22C illustrate intermediate stages in the manufacturing of FinFETs having a cut metal gate, in accordance with some other embodiments.

DETAILED DESCRIPTION

Figure 1A:
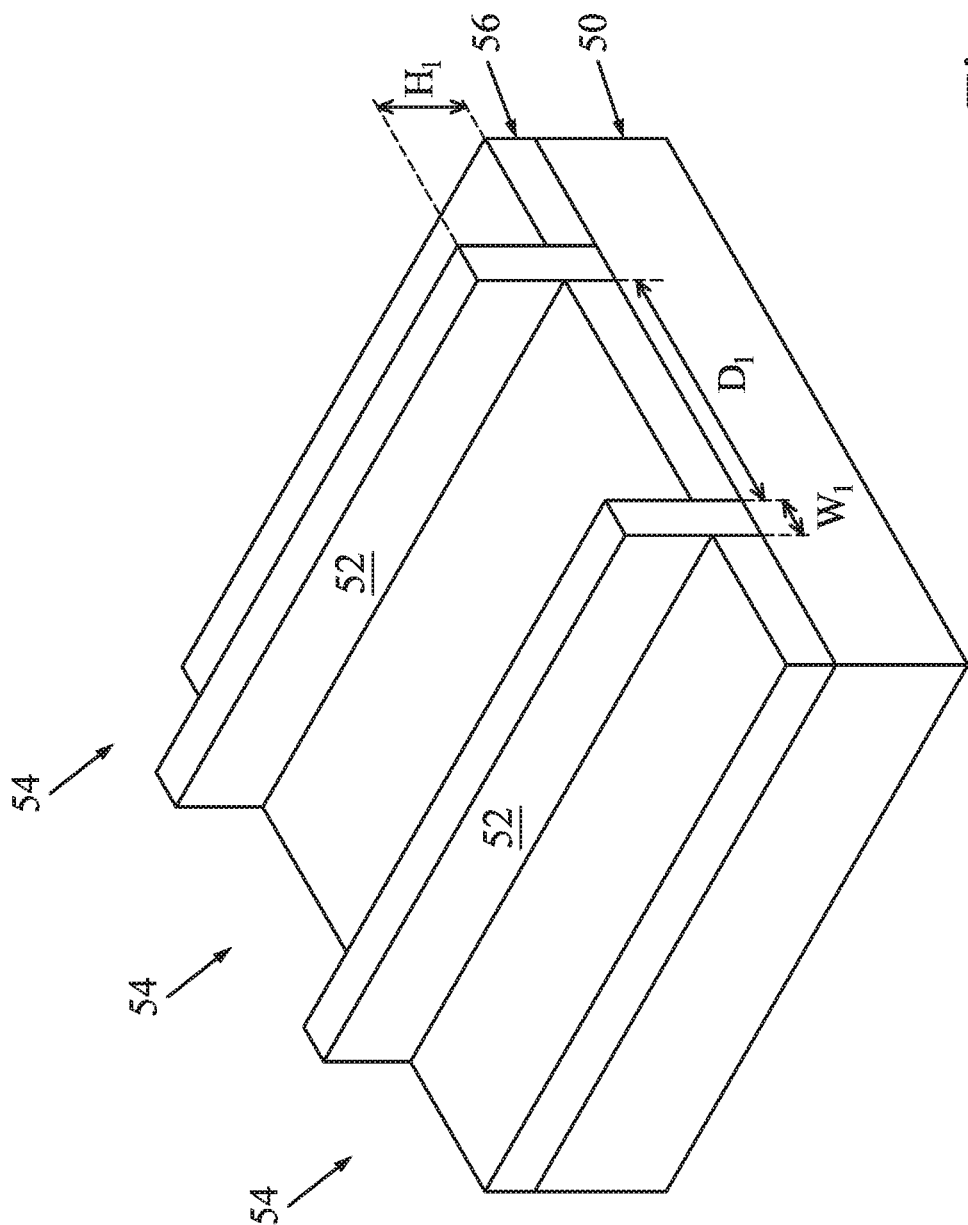
FIGS. 1A through 5C illustrate intermediate stages in the manufacturing of FinFETs, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to semiconductor devices and manufacturing methods thereof. Particular embodiments relate to a semiconductor device comprising a fin field effect transistor (FinFET) with a cut metal gate (CMG) and a method of manufacturing the semiconductor device. Embodiments disclosed herein are directed towards the formation of a plurality of FinFETs within a wafer.

Embodiments discussed herein may be discussed in a specific context, namely a cut metal gate (CMG) isolation structure formed in a CMG trench that improves the resistive-capacitive delay for the device and without degrading the threshold voltage of the device. In some embodiments, the CMG isolation structure includes multiple layers with a silicon nitride layer, a silicon layer, and a silicon oxide layer. In some embodiments, the silicon nitride layer acts as a barrier layer to prevent the diffusion of the materials of the gate stacks into the CMG trenches during subsequent processing. In some embodiments, the silicon layer acts as a barrier to oxidation of the underlying barrier layer and the gate stacks. Because the silicon layer protects the underlying layers from oxidation, a silicon oxide layer can be formed on the silicon layer, which reduces the dielectric constant of the CMG isolation structure. Further, by protecting the underlying layers (e.g., the gate stacks) from oxidation, the threshold voltages of the devices can be maintained while utilizing a CMG approach.

FIGS. 1A through 5C illustrate intermediate stages in the manufacturing of FinFETs, in accordance with some embodiments. FIGS. 1A, 2A, 3A, 4A, and 5A are three-dimensional views. FIGS. 1B, 2B, 3B, 4B, and 5B are cross-sectional views shown along a longitudinal axis of the FinFETs, e.g., perpendicular to the direction of current flow between the source/drain regions of the FinFETs, and are shown for a single FinFET. FIGS. 1C, 2C, 3C, 4C, and 5C are cross-sectional views shown along a latitudinal axis of the FinFETs, e.g., parallel to the direction of current flow between the source/drain regions of the FinFETs, and are shown for a single FinFET. FIG. 2D is a cross-sectional view shown along a longitudinal axis of the FinFETs, through source/drain regions of the FinFETs.

Some embodiments discussed herein are discussed in the context of FinFETs formed using a gate-last process. In other embodiments, a gate-first process may be used. Also, some embodiments contemplate aspects used in planar devices, such as planar FETs.

Figure 1C:
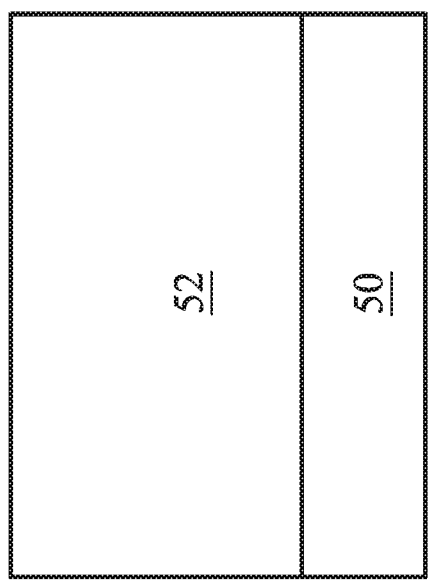
Figure 1B:
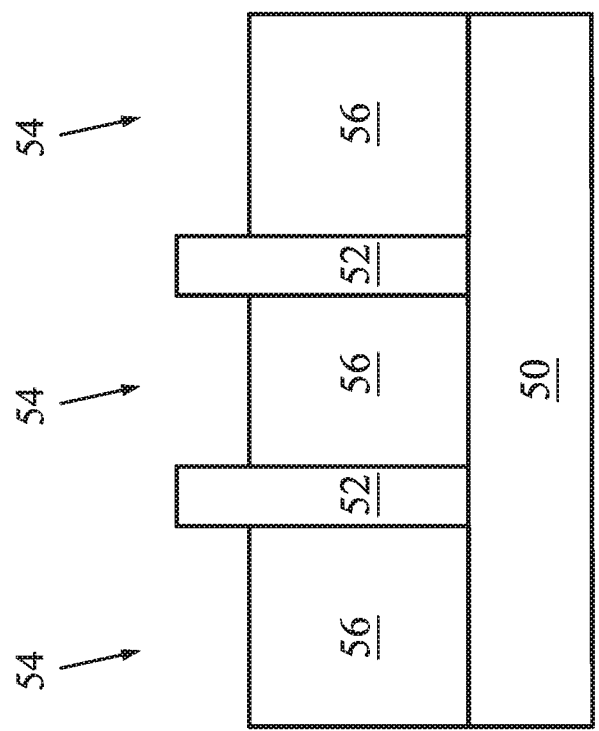

In FIGS. 1A through 1C, a substrate 50 is provided. The substrate 50 may be a semiconductor substrate, such as a bulk semiconductor, a semiconductor-on-insulator (SOI) substrate, a strained SOI substrate, a silicon germanium on insulator substrate, or the like, which may be doped (e.g., with a p-type or an n-type dopant) or undoped. The substrate 50 may be a wafer, such as a silicon wafer. Other substrates, such as a multi-layered or gradient substrate may also be used. One region of the substrate 50 is illustrated, which can be for forming n-type devices (such as NMOS transistors, e.g., n-type FinFETs) or for forming p-type devices (such as PMOS transistors, e.g., p-type FinFETs). The substrate 50 may include multiple, physically separated regions, in which any number of device features (e.g., other active devices, doped regions, isolation structures, etc.) may be formed.

Further, fins 52 are formed extending from the substrate 50. The fins 52 are semiconductor strips. In the embodiment shown, the fins 52 are an epitaxially grown semiconductor material, different from the material of the substrate 50. The fins 52 may be formed from silicon, silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming a III-V compound semiconductor include, but are not limited to, InAs, AlAs, GaAs, InP, GaN, InGaAs, InAlAs, GaSb, AlSb, AlP, GaP, and the like. In the embodiment shown, the fins 52 are formed by epitaxially growing a layer of the semiconductor material on the substrate 50, and then etching trenches 54 in the semiconductor material, with the fins 52 being formed from portions of the semiconductor material that remain unremoved. The etching may be any acceptable etch process, such as a reactive ion etch (RIE), neutral beam etch (NBE), the like, or a combination thereof. The etch may be anisotropic. In other embodiments, the fins 52 are the same material as the substrate 50, and are formed by etching trenches in the substrate 50. As discussed below, the fins 52 are used to form channel regions of FinFETs. Although only two fins 52 are illustrated, it should be appreciated that any number of fins 52 may be formed.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As one of ordinary skill in the art will recognize, the processes and materials described above to form the fins 52 are merely example processes, and are not meant to be the only embodiments. Rather, any suitable process through which the fins 52 may be formed may be utilized and any suitable process, including any number of masking and removal steps may be used. Once formed, these fins 52 may be used, as discussed below, to form the channel regions and source/drain (S/D) regions of a plurality of FinFET transistors.

The fins 52 are formed to a width $W_1$ at the surface of the substrate 50. In some embodiments, the width $W_1$ is in the range of about 6 nm to about 600 nm. Additionally, the fins 52 are spaced apart from each other by a distance $D_1$. By spacing the fins 52 in such a fashion, the fins 52 may each form a separate channel region while still being close enough to share a common gate. As discussed further below, the distance $D_1$ is selected in such a way as to help reduce the contact resistance ($R_c$) of subsequently formed contacts to the gate of the FinFETs. In some embodiments, the distance $D_1$ is large, such as in the range of about 22 nm to about 800 nm. In some embodiments, the distance $D_1$ is small, such as in the range of about 22 nm to about 200 nm.

Further, shallow trench isolation (STI) regions 56 are formed between the fins 52. The STI regions 56 may be formed by filling the trenches 54 with a dielectric material and recessing the dielectric material in the trenches 54 to form the STI regions 56. The dielectric material may be an oxide material, a high-density plasma (HDP) oxide, or the like. The dielectric material may be formed, after an optional cleaning and lining of the trenches 54, using a chemical vapor deposition (CVD) method, a high density plasma CVD method, or other suitable method of formation as is known in the art.

The trenches 54 may be filled by overfilling the trenches 54 and the substrate 50 with the dielectric material and then removing the excess material outside of the trenches 54 and the fins 52 through a suitable process such as chemical mechanical polishing (CMP), an etch, a combination thereof, or the like. In an embodiment, the removal process removes dielectric material overlying the fins 52, so that top surfaces of the fins 52 are exposed.

Once the trenches 54 have been filled with the dielectric material, the dielectric material may then be recessed from the top surfaces of the fins 52. The recessing may be performed to expose at least a portion of the sidewalls of the fins 52 adjacent to the top surfaces of the fins 52. The dielectric material may be recessed using a wet etch by dipping the top surfaces of the fins 52 into an etchant such as HF, although other etchants, such as $H_2$, and other methods, such as a reactive ion etch, a dry etch with etchants such as $NH_3/NF_3$, chemical oxide removal, or dry chemical clean, may be used. The dielectric material is recessed such that the exposed portions of the fins 52 have a first height $H_1$. In some embodiments, the first height $H_1$ is in the range of about 40 Å to about 100 Å. Additionally, the recessing may also remove any leftover dielectric material located over the fins 52, exposing the fins 52 for further processing.

The steps described above may be only part of the overall process flow used to fill and recess the dielectric material. For example, lining steps, cleaning steps, annealing steps, gap filling steps, combinations of these, and the like may also be utilized to form and fill the trenches with the dielectric material. All of the potential process steps are fully intended to be included within the scope of the present embodiments.

Figure 2A:
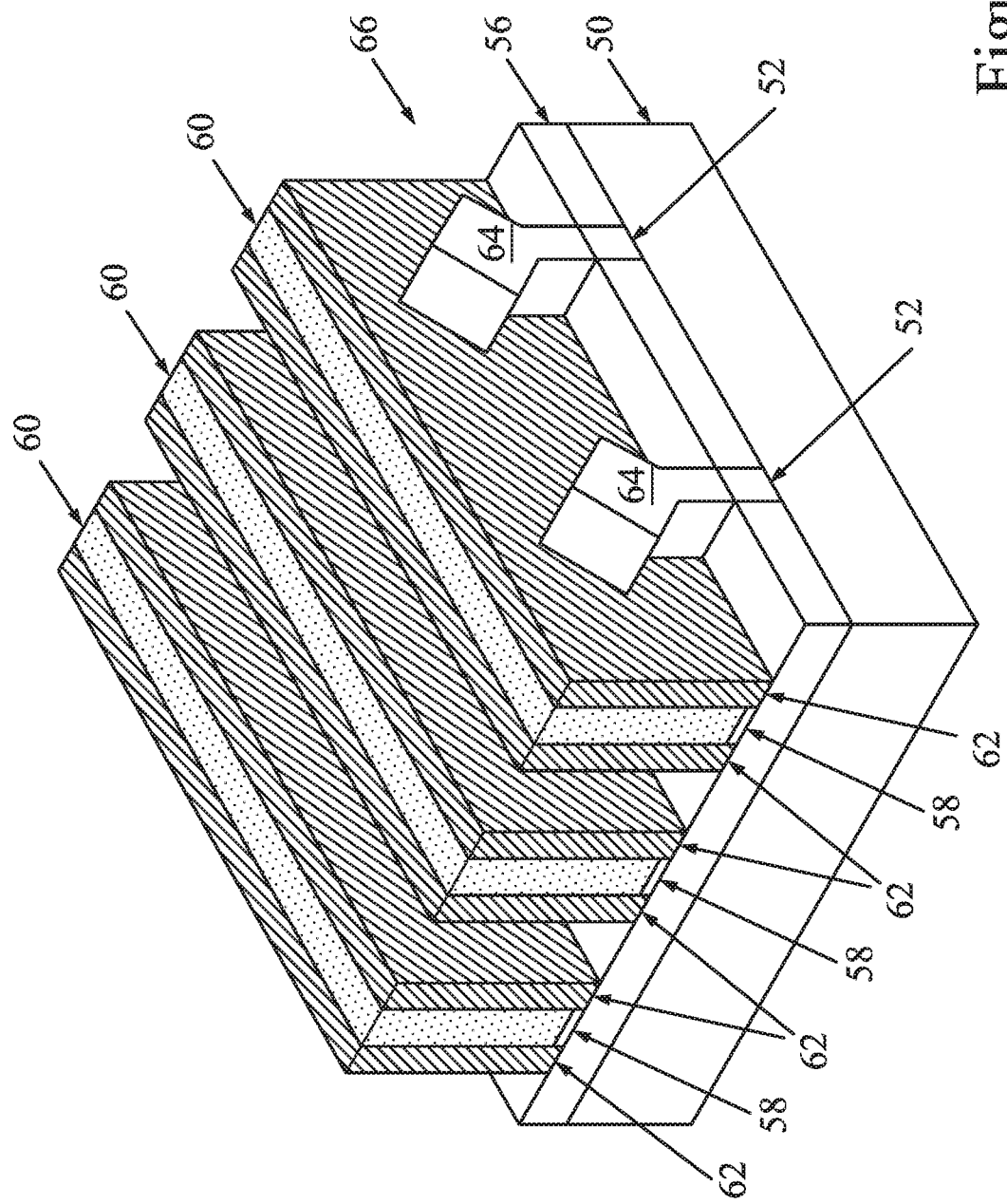
Figure 2C:
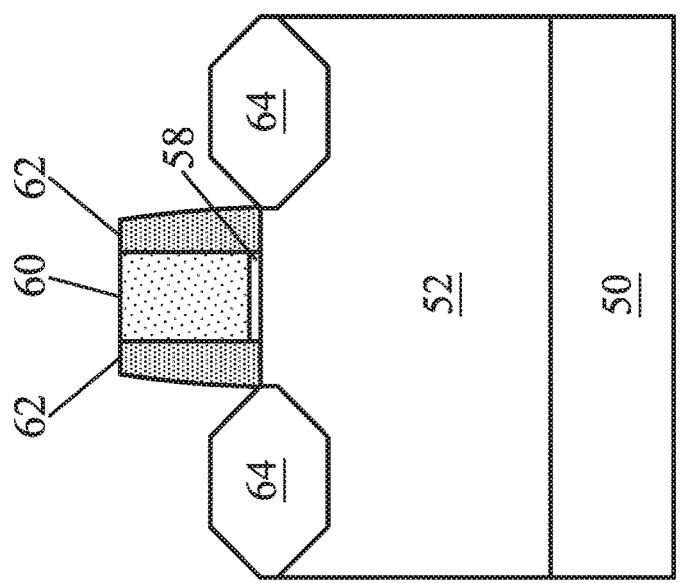
Figure 2B:
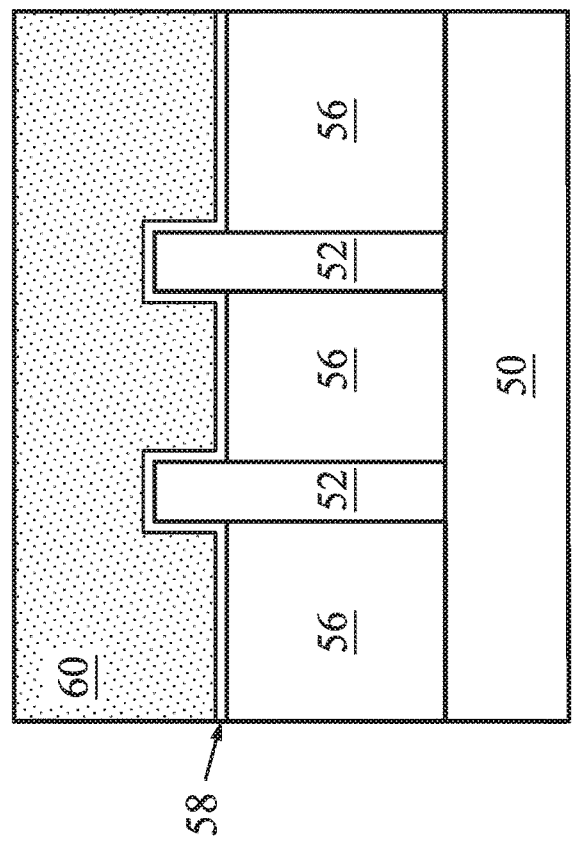
Figure 2D:
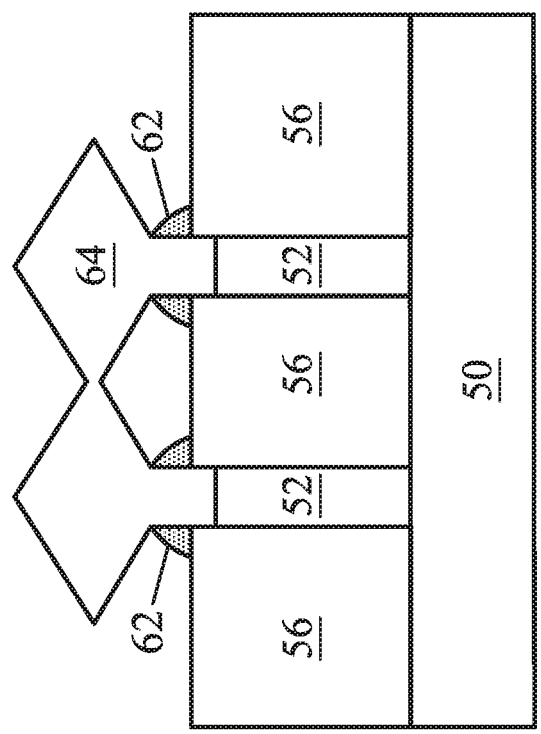

In FIGS. 2A through 2C, dummy gate dielectrics 58 and dummy gate electrodes 60 are formed over each of the fins 52. In some embodiments, a dummy gate dielectric layer is formed by thermal oxidation, chemical vapor deposition, sputtering, or any other methods known and used in the art for forming dielectric layers. Depending on the technique of gate dielectric formation, the dummy gate dielectric layer thickness on the top of the fins 52 may be different from the dummy gate dielectric layer thickness on the sidewalls of the fins 52.

The dummy gate dielectric layer may comprise a material such as silicon dioxide or silicon oxynitride with a thickness of between about 3 Å and about 100 Å, such as about 10 Å. The dummy gate dielectric layer may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectric layer.

A dummy gate electrode layer is then formed on the dummy gate dielectric layer. The dummy gate electrode layer may be formed from a conductive material such as polycrystalline-silicon (polysilicon), e.g., a dummy polysilicon (DPO), poly-crystalline silicon-germanium (poly-SiGe), metallic nitrides, metallic silicides, metallic oxides, metals, or the like, including for example W, Al, Cu, AlCu, W, Ti, TiAlN, TaC, TaCN, TaSiN, Mn, Zr, TiN, Ta, TaN, Co, Ni, combinations of these, or the like. The dummy date electrode layer may be formed by a deposition process such as physical vapor deposition (PVD), chemical vapor deposition (CVD), sputter deposition, or the like. The thickness of the dummy gate electrode layer may be between about 5 Å and about 200 Å. The top surface of the dummy gate electrode layer may have a non-planar top surface, and may be planarized prior to patterning of the dummy gate electrode layer or performing the gate etching process. Ions may or may not be introduced into the dummy gate electrode layer at this point. Ions may be introduced, for example, by ion implantation techniques.

The dummy gate electrode layer and dummy gate dielectric layer are then patterned, such as by acceptable photolithography and etching processes, with remaining portions of the dummy gate dielectric layer and dummy gate electrode layer, respectively, forming the dummy gate dielectrics 58 and dummy gate electrodes 60 (collectively "dummy gates"). The dummy gates define multiple channel regions located on each side of the fins 52 beneath the dummy gate dielectric layer. The dummy gates may be formed by depositing and patterning a gate mask on the dummy gate electrode layer using, for example, any suitable deposition and photolithography techniques. The gate mask may incorporate any suitable masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode layer and the dummy gate dielectric layer may be etched using a dry etching process to form the patterned dummy gates.

Further, gate spacers 62 are formed on opposing sides of the dummy gate electrodes 60, over each of the fins 52. In some embodiments, the gate spacers 62 are formed, for example, by blanket depositing a spacer layer on the previously formed structure. The spacer layer may comprise SiCON, SiN, oxynitride, SiC, SiON, SiOC, oxide, or the like and may be formed by any suitable methods to form such a layer, such as chemical vapor deposition (CVD), plasma enhanced chemical vapor deposition (PECVD), sputter, and any other suitable methods. The spacer layer may comprise a different material with different etch characteristics or the same material as the dielectric material within the STI regions 56. The spacer layer is then patterned, such as by one or more etches to remove horizontal portions of the spacer layer, with remaining vertical portions of the spacer layer forming the gate spacers 62.

In some embodiments, once the gate spacers 62 have been formed, a removal of portions of the fins 52 not protected by the dummy gates and the gate spacers 62 may be removed using a reactive ion etch (RIE) using the dummy gates and the gate spacers 62 as hardmasks, or by using any other suitable removal process. The removal process may be continued until the fins 52 are either planar with or below the surface of the STI regions 56.

Epitaxial source/drain regions 64 are formed in the fins 52, such that each dummy gate electrode 60 is laterally disposed between respective neighboring pairs of the epitaxial source/drain regions 64. The epitaxial source/drain regions 64 exert stress in what will be the channel regions of the resulting FinFETs, thereby improving performance. The gate spacers 62 separate the epitaxial source/drain regions 64 from the dummy gate electrodes 60 by an appropriate lateral distance so that the epitaxial source/drain regions 64 do not short out subsequently formed gates of the resulting FinFETs. The epitaxial source/drain regions 64 are formed by etching recesses in the fins 52. Then, the epitaxial source/drain regions 64 in the region are epitaxially grown in the recesses. The epitaxial source/drain regions 64 may include any acceptable material, such as appropriate for n-type or p-type FinFETs. For example, when n-type FinFETs are formed, the epitaxial source/drain regions 64 may include materials exerting a tensile strain in the channel region of the fins 52, such as silicon, SiC, SiCP, SiP, or the like. Likewise, when p-type FinFETs are formed, the epitaxial source/drain regions 64 may include materials exerting a compressive strain in the channel region of the fins 52, such as SiGe, SiGeB, Ge, GeSn, or the like. The epitaxial source/drain regions 64 may have surfaces raised from respective surfaces of the fins 52 and may have facets.

In an embodiment where the fins 52 comprise silicon and the FinFET is a p-type device, the source/drain regions 64 may be regrown with a material, such as silicon, silicon germanium, silicon phosphorous, which has a different lattice constant than the channel regions. The epitaxial growth process may use precursors such as silane, dichlorosilane, germane, or the like, and may continue for between about 5 minutes and about 120 minutes, such as about 30 minutes. In other embodiments the source/drain regions 64 may comprise materials such as GaAs, GaP, GaN, InP, InAs, InSb, GaAsP, AlGaN, AlInAs, AlGaAs, GaInAs, GaInP, and/or GaInAsP, combinations thereof, or the like.

In some embodiments, once the source/drain regions 64 are formed, dopants may be implanted into the source/drain regions 64 by implanting appropriate dopants to complement the dopants in the fins 52. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy gates and the gate spacers 62 as masks. However, any other suitable processes, steps, or the like may be used to implant the dopants. For example, a plurality of implantation processes may be performed using various combinations of spacers and liners to form source/drain regions having a specific shape or characteristic suitable for a particular purpose. Any of these processes may be used to implant the dopants, and the above description is not meant to limit the present embodiments to the steps presented above.

As a result of the epitaxy processes used to form the epitaxial source/drain regions 64, upper surfaces of the epitaxial source/drain regions 64 have facets which expand laterally outward beyond sidewalls of the fins 52. In the embodiment shown in FIGS. 2A through 2C, adjacent epitaxial source/drain regions 64 remain separated after the epitaxy process is completed. In other embodiments, such as that shown in FIG. 2D, these facets cause adjacent epitaxial source/drain regions 64 of a same FinFET to merge.

Figure 3A:
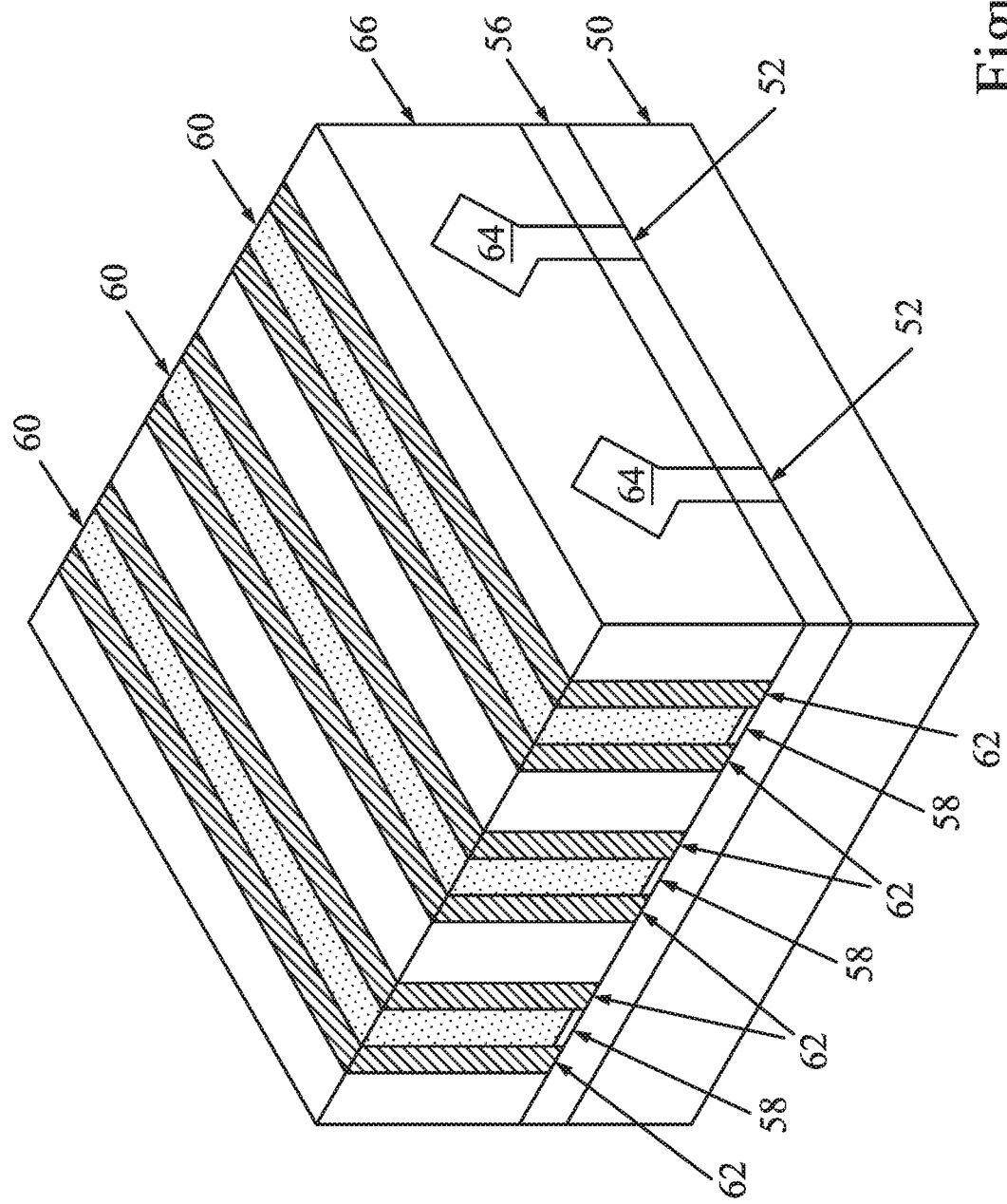
Figure 3C:
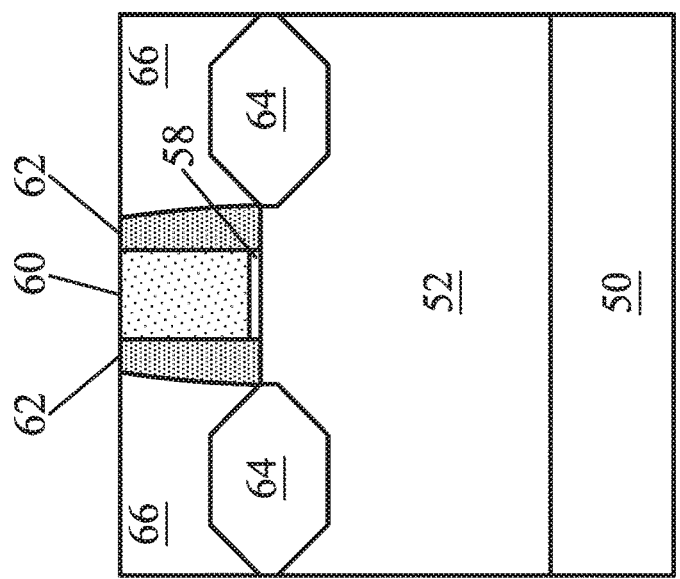
Figure 3B:
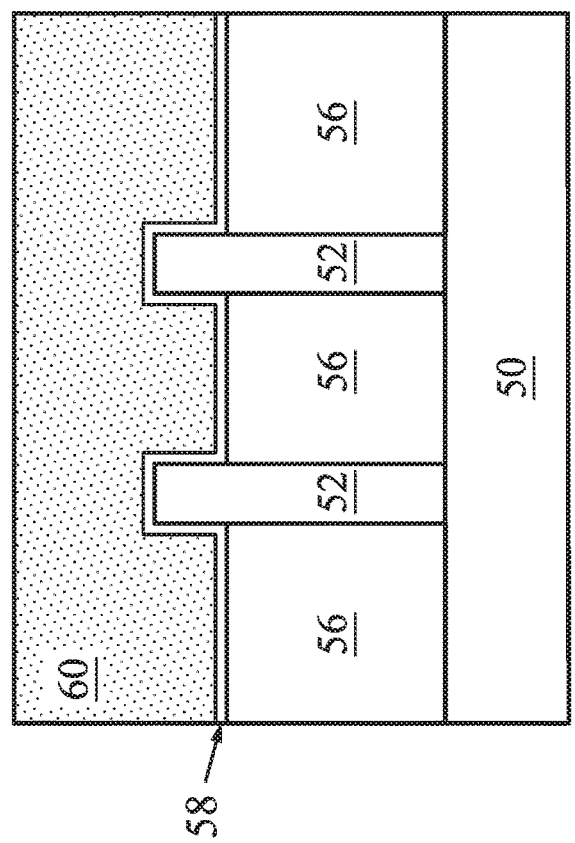

In FIGS. 3A through 3C, an inter-layer dielectric (ILD) 66 (e.g., ILD0 layer) is deposited over the substrate 50. The ILD 66 may be formed of a dielectric material, and may be deposited by any suitable method, such as CVD, PECVD, or flowable CVD (FCVD). Dielectric materials may include silicon oxide (SiO2), Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

In some embodiments, a contact etch stop layer is disposed between the ILD 66 and the epitaxial source/drain regions 64, the gate spacers 62, and the dummy gate electrodes 60. The contact etch stop layer may include a dielectric material, such as silicon nitride, silicon oxide, silicon oxynitride, or the like, having a different etch rate than the material of the ILD 66 and may be deposited within a deposition chamber using, for example, one or more of a chemical vapor deposition (CVD), an atomic layer deposition (ALD) process, a plasma enhanced chemical vapor deposition (PECVD), a low pressure chemical vapor deposition (LPCVD), or the like. However, any suitable materials and any suitable processes may be utilized to deposit the contact etch stop layer.

In some embodiments, once formed, the ILD 66 may be annealed using, e.g., a first annealing process. In an embodiment the first annealing process may be a thermal anneal in which the substrate 50 and the ILD 66 are heated, e.g., in a furnace, in an inert atmosphere. The first anneal process may be performed at a temperature of between about 200° C. and about 1000° C., such as about 500° C., and may be continued for a time of between about 60 s and about 360 min, such as about 240 min.

In some embodiments, a planarization process, such as a CMP, is performed to level the top surface of the ILD 66 with the top surfaces of the dummy gate electrodes 60 and the gate spacers 62.

Figure 4A:
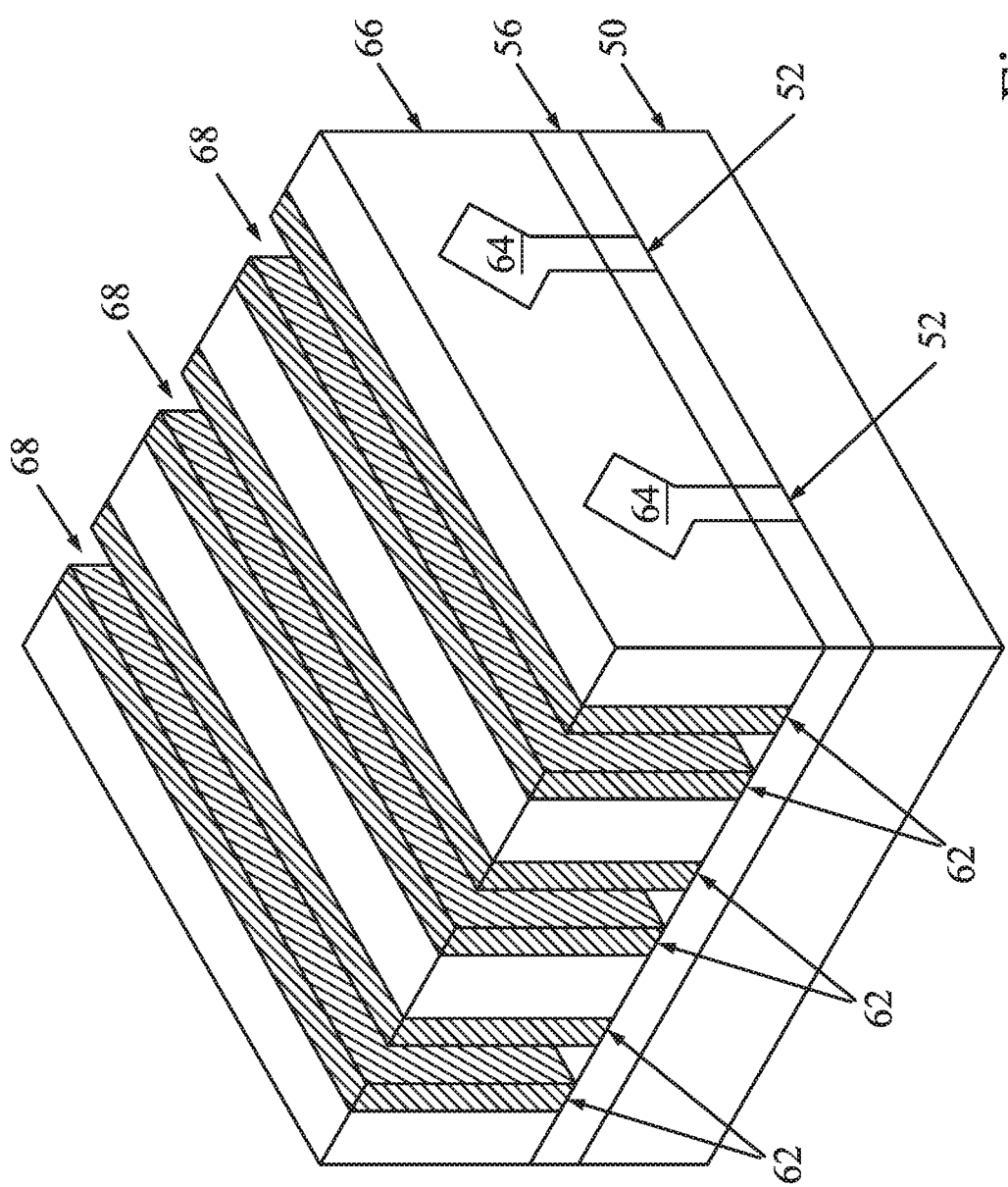
Figure 4C:
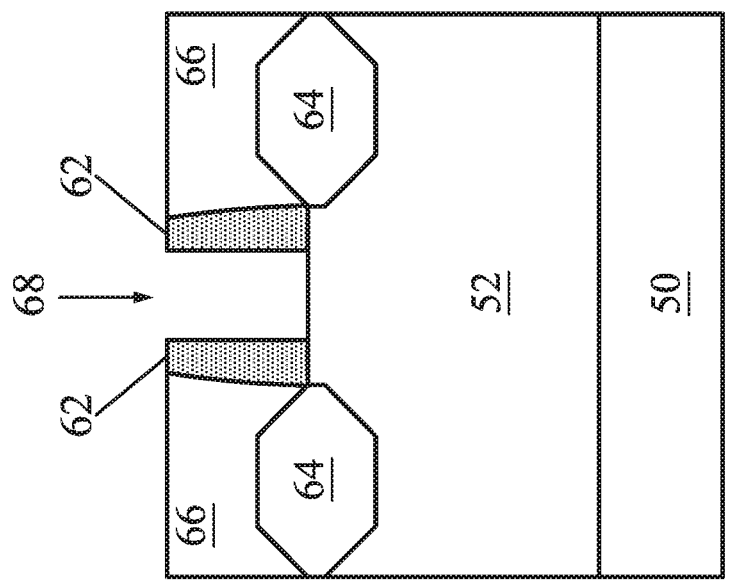
Figure 4B:
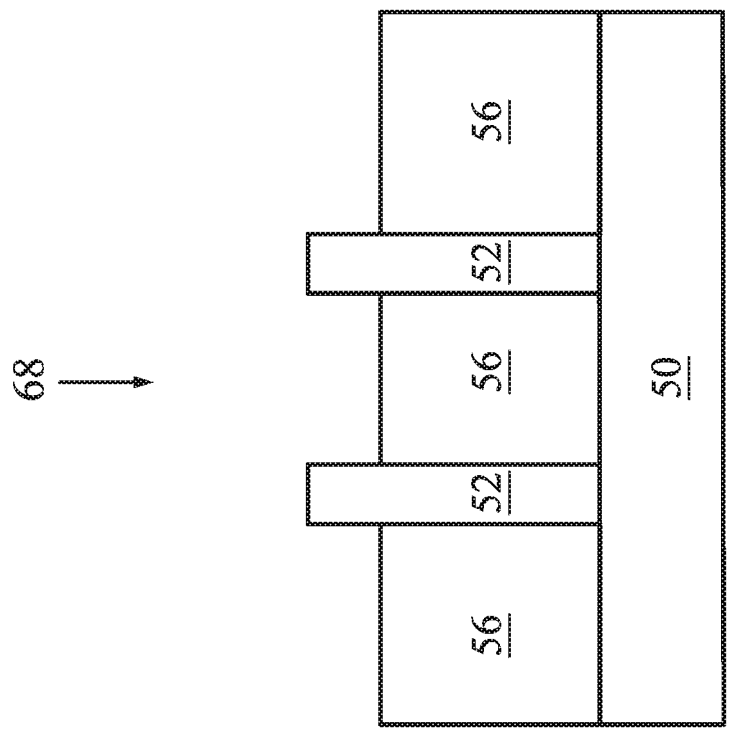

In FIGS. 4A through 4C, the dummy gate electrodes 60 and dummy gate dielectrics 58 are removed in one or more etching step(s), e.g., a wet etch process, so that recesses 68 are formed. Each recess 68 exposes a channel region of a respective fin 52. Each channel region is laterally disposed between neighboring pairs of the epitaxial source/drain regions 64. During the removal, the dummy gate dielectrics 58 may be used as etch stop layers when the dummy gate electrodes 60 are etched. The dummy gate dielectrics 58 may then be optionally removed after the removal of the dummy gate electrodes 60.

Figure 5A:
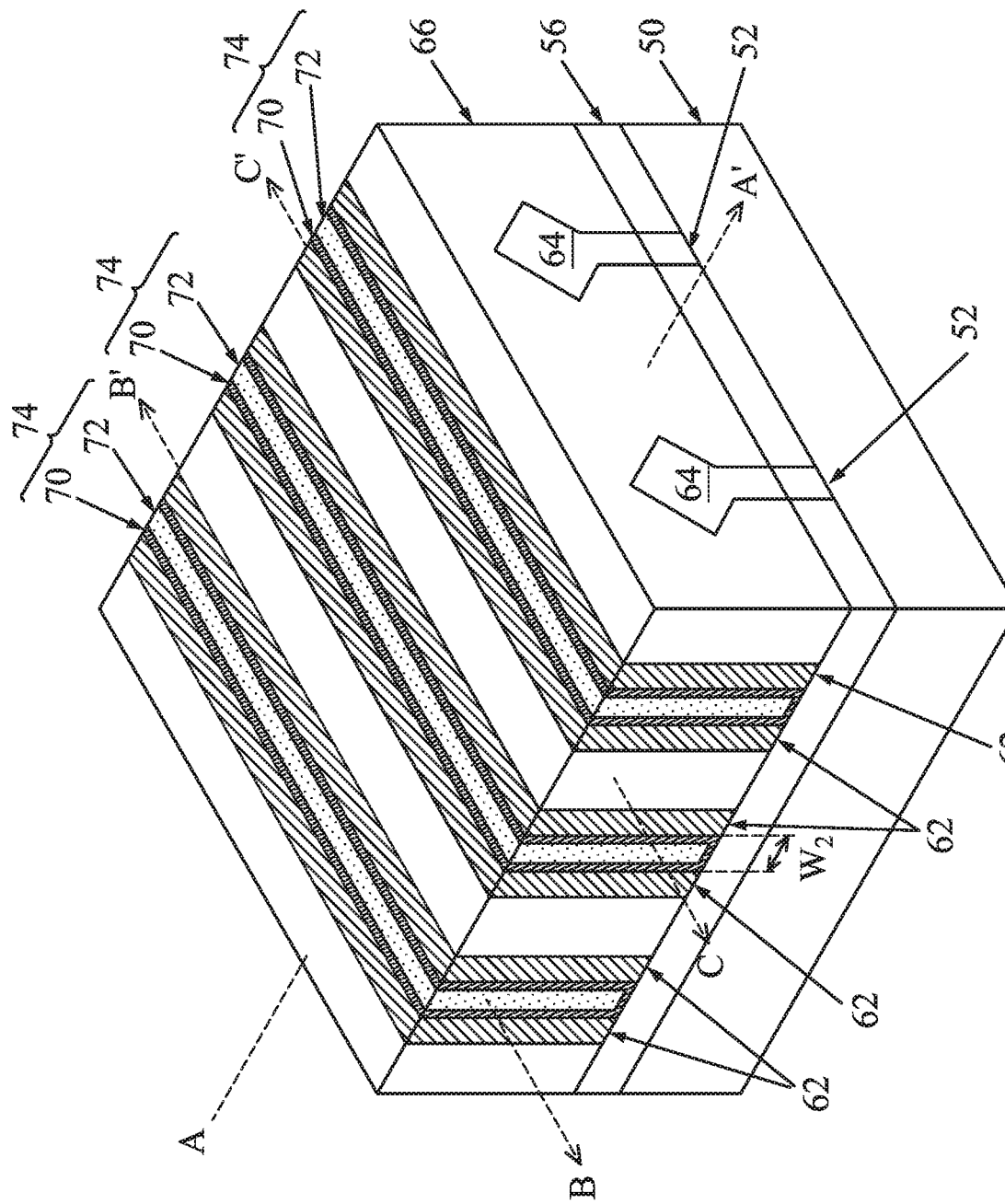
Figure 5C:
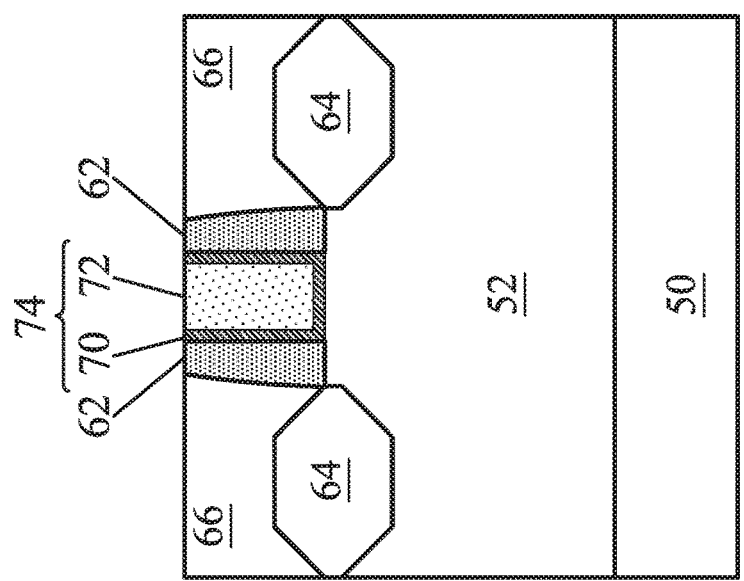
Figure 5B:
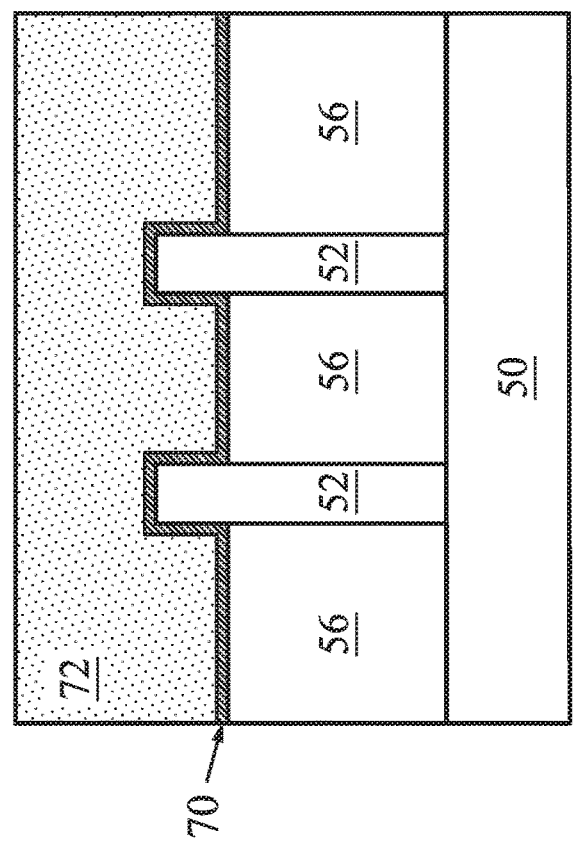

In FIGS. 5A through 5C, gate dielectrics 70 and gate electrodes 72 are formed for replacement gates. The replacement gates may include, for example, a gate dielectric, one or more conductive barrier layers, one or more work function layers, and a conductive fill material. The gate dielectrics 70 are conformally deposited in the recesses 68, such as on the top surfaces and the sidewalls of the fins 52 and on sidewalls of the gate spacers 62. The gate dielectrics 70 may also be formed on top surfaces of the ILD 66. In accordance with some embodiments, the gate dielectrics 70 include silicon oxide, silicon nitride, or multilayers thereof.

In some embodiments, the gate dielectrics 70 include a high-k dielectric material, and in these embodiments, the gate dielectrics 70 may have a k value greater than about 7.0, and may include a metal oxide or a silicate of Hf, Al, Zr, La, Mg, Ba, Ti, Pb, and combinations thereof. According to some embodiments, the high-k gate dielectric includes materials such as $HfO_2$, $ZrO_2$, $HfZrO_x$, $HfSiO_x$, $HfSiON$, $ZrSiO_x$, $HfZrSiO_x$, $Al_2O_3$, $HfAlO_x$, $HfAlN$, $ZrAlO_x$, $La_2O_3$, $TiO_2$, $Yb_2O_3$, or the like and may be a single layer or a composite layer that is formed using a deposition process such as atomic layer deposition. However, any suitable materials and any suitable processes may be used to form the high-k gate dielectric.

The formation methods of the gate dielectrics 70 may include Molecular-Beam Deposition (MBD), atomic layer deposition, PECVD, and the like. In embodiments where portions of the dummy gate dielectrics 58 remain in the recesses 68, the gate dielectrics 70 include a material of the dummy gate dielectrics 58 (e.g., $SiO_2$).

The gate electrodes 72 are deposited over the gate dielectrics 70, respectively, and fill the remaining portions of the recesses 68. The gate electrodes 72 may include a metal-containing material such as TiN, TiO, TaN, TaC, Co, Ru, Al, W, combinations thereof, or multi-layers thereof. The gate electrodes 72 may be formed by a deposition process such as atomic layer deposition (ALD). The gate electrodes 72 may include any number of liner layers, work function tuning layers, and fill materials.

According to some embodiments, one or more diffusion barrier layers and one or more work function tuning layers may be formed as a plurality of stacked layers. For example, the barrier layers may be formed as a layer of titanium nitride (TiN) which may (or may not) be doped with silicon. The work function tuning layer, in the case of a p-type FinFET, may be formed with a respective gate electrode 72 as a stacked layer including Ti, Al, TiAl, TiAlN, Ta, TaN, TiAlC, TaAlCSi, TaAlC, TiSiN, or the like. In the case of an n-type FinFET being formed with a respective gate electrode 72, the work function tuning layer may be formed with a respective gate electrode 72 as a stacked layer including TiN, TaN, TiAl, W, Ta, Ni, Pt, or the like. After the deposition of the work function tuning layer(s) in these embodiments, a barrier layer (e.g., another TiN layer) may be formed.

According to some embodiments, the conductive fill material may be formed from a material such as tungsten, cobalt, copper, ruthenium, aluminum, or the like. The conductive fill material is deposited over the gate dielectric, the one or more conductive barrier layers, and the one or more work function tuning layers such that the remaining spaces between respective spacers 62 of a respective gate electrode 72 are filled or over-filled.

After the filling (or over-filling) of the gate electrodes 72, a planarization process, such as a CMP, may be performed to remove the excess portions of the gate dielectrics 70 and the material of the gate electrodes 72, which excess portions are over the top surface of the ILD 66. The remaining portions of material of the gate electrodes 72 and the gate dielectrics 70 thus form replacement gates of the resulting FinFETs. The gate electrodes 72 and the gate dielectrics 70 may be collectively referred to as gate stacks 74. The gate stacks 74 extend along sidewalls of a channel region of the fins 52.

In some embodiments, once the ILD 66 has been planarized and the planar surfaces of the gate stacks 74 and the gate spacers 62 are exposed, the ILD 66 may again be annealed using, e.g. a second annealing process. In an embodiment the second annealing process may be a thermal anneal in which the substrate 50 and the ILD 66 are heated, e.g., in a furnace, in an inert atmosphere. The second annealing process may be performed at a temperature of between about 200° C. and about 1000° C., such as about 500° C., and may be continued for a time of between about 60 s and about 360 min, such as about 240 min.

After formation, the gate stacks 74 have a width $W_2$. In some embodiments, the width $W_2$ is in the range of about 6 nm to about 300 nm. As discussed further below, the distance $D_1$ between the fins 52 (see FIG. 1A) is selected according to the width $W_2$ of the gate stacks 74 that are formed.

FIG. 5A further illustrates reference cross-sections that are used in later figures. Cross-section A-A' is between fins 52 and parallel to a longitudinal axis of the fins 52. Cross-section B-B' is perpendicular to cross-section A-A' and is along a longitudinal axis of a gate stack 74 and in a direction, for example, perpendicular to the current flow between the epitaxial source/drain regions 64 of the FinFETs. Cross-section C-C' is parallel to cross-section B-B' and extends through the epitaxial source/drain regions 64 of the FinFETs. Subsequent figures refer to these reference cross-sections for clarity.

FIGS. 6A-19C and 21A-22C represent cross-sectional views that are taken through an intermediate structure formed using the intermediate steps associated with the respective figures. FIGS. 6A, 7A, 8A, 9A, 10A, 11A, 12A, 13A, 14A, 15A, 16A, 17A, 18A, 19A, 21A, and 22A ("the 'A' cross-sectional views") are taken along line A-A' of FIG. 5A except with a different number of gate stacks 74. FIGS. 6B, 7B, 8B, 9B, 10B, 11B, 12B, 13B, 14B, 15B, 16B, 17B, 18B, 19B, 21B, and 22B ("the 'B' cross-sectional views") are views taken along line B-B' of FIG. 5A except with a different number of fins 52. FIGS. 6C, 7C, 8C, 9C, 10C, 11C, 12C, 13C, 14C, 15C, 16C, 17C, 18C, 19C, 21C, and 22C ("the 'C' cross-sectional views") are views taken along line C-C' of FIG. 5A except with a different number of fins 52. Please note that the cross-sections A-A', B-B', and C-C' illustrated in FIG. 5A are shown on an example FinFET structure and the cross-section views in FIGS. 6A-19C and 21A-22C are arranged differently relative to each other. These relative arrangements of these cross-sectional views are shown in the FIGS. 6A-19C and 21A-22C.

In addition, the "A" cross-sectional views are taken through line A-A' illustrated in association with the "B" and "C" cross-sectional views to show a series of gate structures in a direction parallel to the fins of the FinFETS being formed. The "B" cross-sectional views are taken through line B-B' illustrated in association with the "A" and "C" cross-sectional views to show a gate structure of the series of gate structures in an area of a cut metal gate (CMG) of the respective intermediate structures in a direction perpendicular to the fins of the FinFETS being formed. The "C" cross-sectional views are taken through line C-C' illustrated in the associated "A" and "B" cross-sectional views to show an area of an ILDO/EPI interface associated with the cut metal gate (CMG) of the respective intermediate structures in a direction perpendicular to the fins of the FinFETS being formed.

FIGS. 6A-16C illustrate intermediate stages in the manufacturing of FinFETs having a cut metal gate, in accordance with some embodiments. FIGS. 6A-6C illustrate an intermediate structure similar to the intermediate structure of FIGS. 5A-5C and at a same step in the fabrication process of the FinFETs. In FIG. 6A, four gate stacks 74 are shown on the substrate 50, and in FIGS. 6B and 6C, two pairs of the fins 52 are shown in the corresponding views. Though the four gate stacks 74 are shown in a same area of the substrate 50, one of ordinary skill in the art will understand that these gate stacks 74 may be physically separated from each other and any number of device features (e.g., other active devices, doped regions, isolation structures, etc.) may be disposed between the gate stacks 74. For example, the rightmost gate 74 in FIGS. 6A-16C may be in an input/output region of the substrate 50 while the three leftmost gate stacks 74 of FIGS. 6A-16C may be in a memory area of the substrate, such as a static random access memory (SRAM) area. In some embodiments, the gate stacks 74 may have different channel lengths. For example, as illustrated in FIGS. 6A-16C, the rightmost gate stack 74 is wider than the other illustrated gate stacks 74, and thus, the rightmost gate stack 74 may have a longer channel length than the other illustrated gate stacks 74.

Figure 7C:
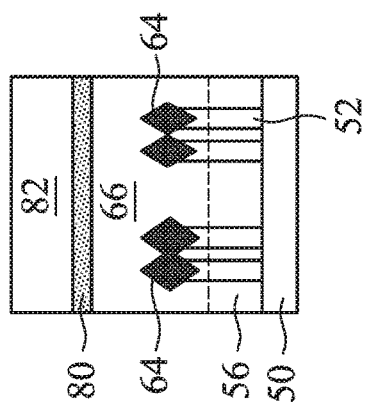
Figure 7B:
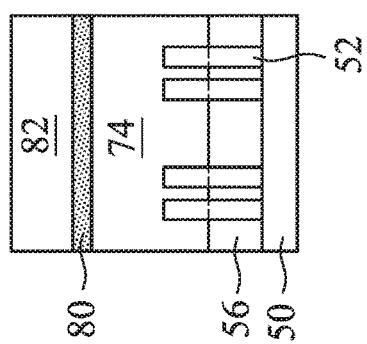
Figure 7A:
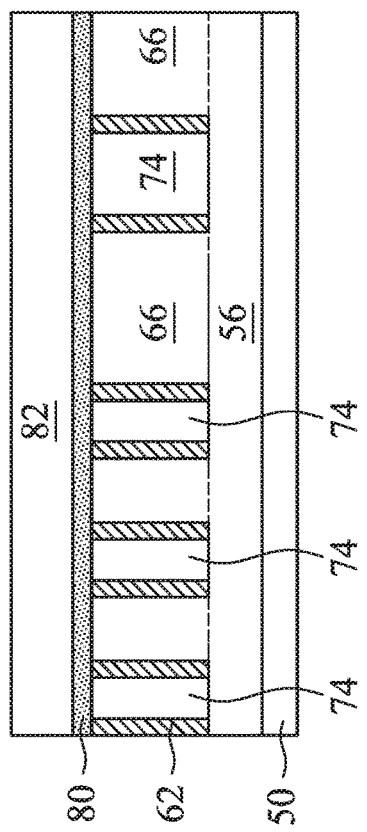

FIGS. 7A-7C illustrate some initial steps in forming a "cut metal gate" (CMG) through one or more of the gate stacks 74 of the intermediate structure illustrated in FIGS. 6A-6C. Once the gate stacks 74 have been planarized, a series of hard mask layers may be formed over the planarized surface of the gate stacks 74 and the ILD 66.

In some embodiments, a first layer in the series of masking layers may be an etch stop layer 80. The etch stop layer 80 may be formed over the planarized surfaces of the gate stacks 74 and the ILD 66 by depositing a material such as Si, TiN, SiN, SiO2, combinations thereof, or the like using a deposition method such as atomic layer deposition (ALD), plasma enhanced chemical vapor deposition (PECVD), chemical vapor deposition (CVD), or the like. However, any suitable materials and any suitable methods may be used to form the etch stop layer 80.

A hard mask layer 82 may be deposited over the etch stop layer 80 as a second layer of the series of masking layers. The hard mask layer 82 is formed over the etch stop layer 80 from a second hard mask material such as SiN, SiO2, combinations thereof, or the like. The second hard mask material used to form the hard mask layer 82 is different from the first hard mask material used to form the etch stop layer 80. As such, the etch stop layer 80 may serve as an etch stop of a subsequent patterning of the hard mask layer 82. According to some embodiments, the hard mask layer 82 may be placed over the etch stop layer 80 using a deposition method such as atomic layer deposition (ALD), plasma enhanced chemical vapor deposition (PECVD), chemical vapor deposition (CVD), or the like. However, any suitable material and process of formation may be used for the hard mask layer 82 in the first series of hard masking layers.

Figure 8C:
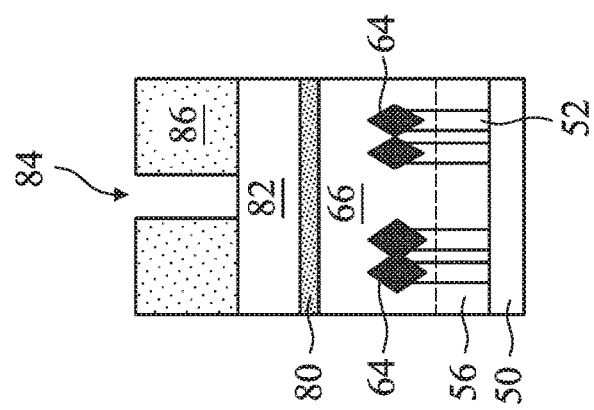
Figure 8B:
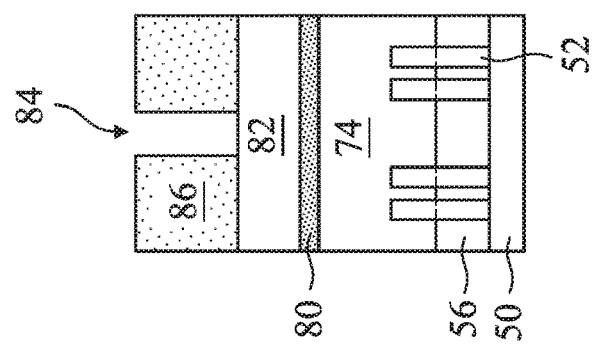
Figure 8A:
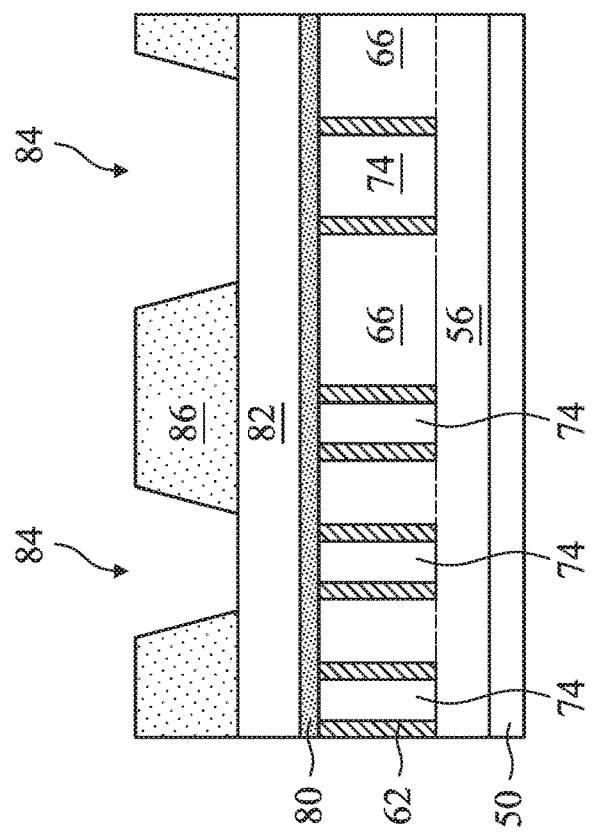

FIGS. 8A-8C illustrate a deposition and patterning process to form openings 84 through a photo resist layer 86 deposited over the hard mask layer 82. According to embodiments, the photo resist layer 86 may be deposited over the hard mask layer 82 as a third layer of the series of masking layers. The photo resist layer 86 may be deposited using any suitable deposition process, may be formed to any suitable thickness, and may be patterned using any suitable photo lithography method to form the openings 84 through the photo resist layer 86 and to expose surfaces of the hard mask layer 82 of the first series of masking layers in areas overlying one or more of the gate stacks 74.

Figure 9C:
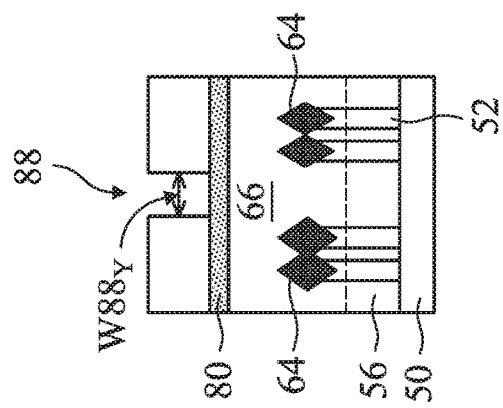
Figure 9B:
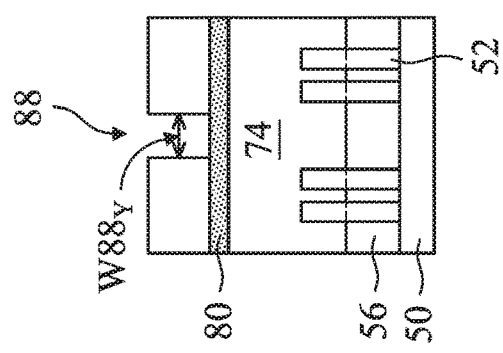
Figure 9A:
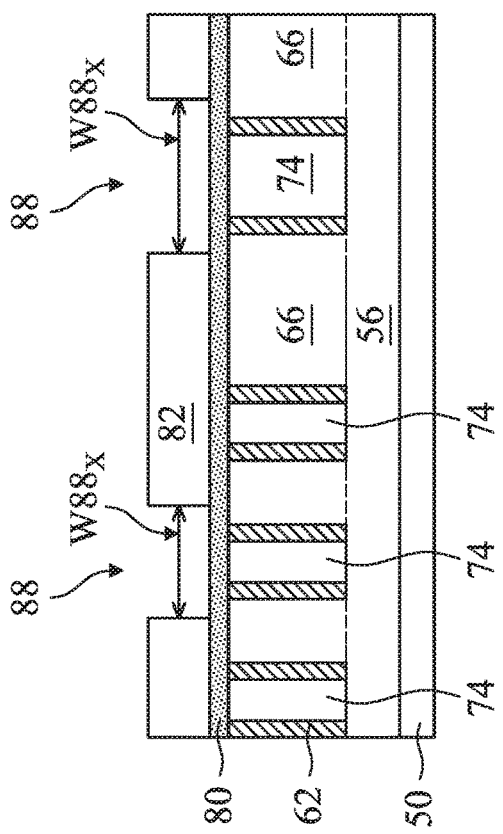

FIGS. 9A-9C illustrate a transferring of the pattern of the photo resist layer 86 of FIGS. 8A-8C into the hard mask layer 82 using a first etchant to form a pattern of openings 88 through the hard mask layer 82. In some embodiments, the first etchant may use reactant gases having a greater etching selectivity for the hard mask material used to form the hard mask layer 82 than the hard mask material used to form the etch stop layer 80. As such, the etch stop layer 80 serves as a etch stop layer and areas of the etch stop layer 80 overlying the one or more of the gate stacks 74 are exposed through the openings 88. In some embodiments, the etching process may be performed using, for example, carbon-and-fluorine-containing gases such as $CF_4$, $CH_2F_2$, $CHF_3$, or the like. However, any suitable gas may be used for the first etchant.

According to some embodiments, the openings 88 in FIG. 9A may be formed to one or more widths W88X of between about 5 nm and about 500 nm, such as about 100 nm and in FIGS. 9B and 9C may be formed to one or more widths W88Y of between about 5 nm and about 50 nm, such as about 30 nm. However, any suitable widths may be used for the openings 88. Once the openings 88 have been formed, the remaining photo resist layer 86 is removed. The remaining photo resist layer 86 may be removed using any suitable process known in the art for removing photo resist layers.

Figure 10A:
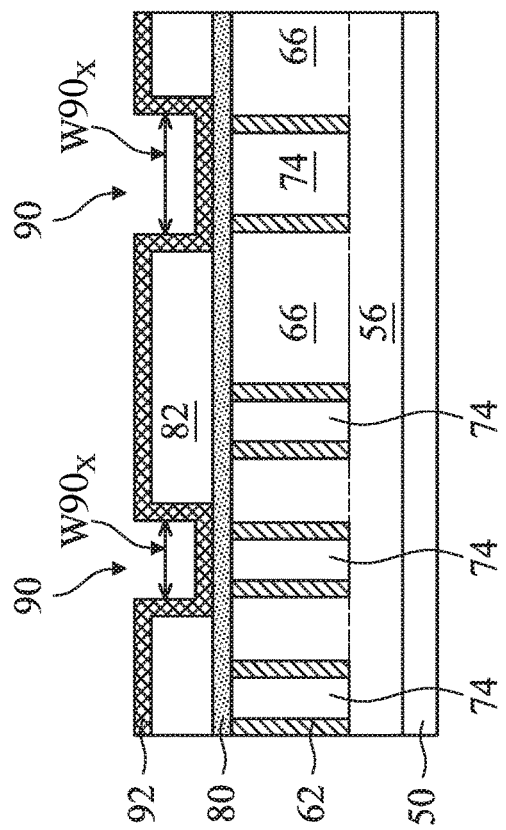
Figure 10B:
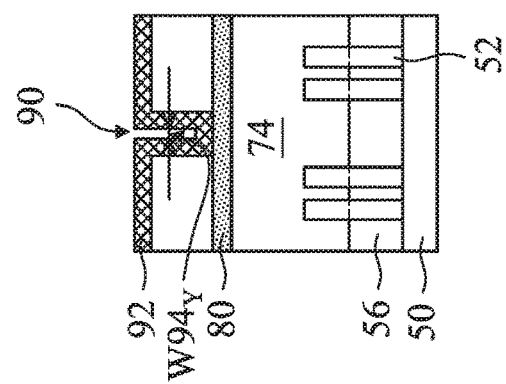
Figure 10C:
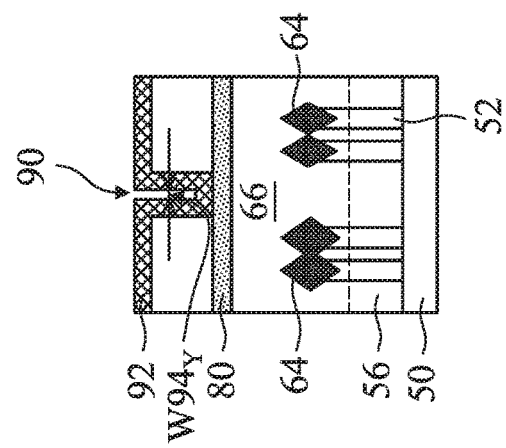

FIGS. 10A-10C illustrate a narrowing of the openings 88 to form narrow openings 90 via a re-deposition of the second hard mask material as a blanket mask layer 92. The blanket mask layer 92 may be formed, for example, through a conformal deposition process such as chemical vapor deposition (CVD) or atomic layer deposition (ALD) such that the blanket mask layer 92 lines the exposed surfaces of the etch stop layer 80, lines the exposed surfaces of the hard mask layer 82, and lines the sidewalls of the openings 88 through the hard mask layer 82. According to some embodiments, the blanket mask layer 92 may be formed of the same hard mask material (e.g., silicon nitride) used to form the hard mask layer 82. In embodiments, the blanket mask layer 92 is formed to a highly uniform thickness of between about 10 Å and about 100 Å, such as about 50 Å. As such, the narrow openings 90 in FIG. 10A may be formed to one or more widths W90X of between about 5 nm and about 500 nm, such as about 100 nm and in FIGS. 10B and 10C may be formed to one or more widths W90Y of between about 5 nm and about 50 nm, such as about 30 nm. However, any suitable widths may be used for the narrow openings 90.

Figure 11C:
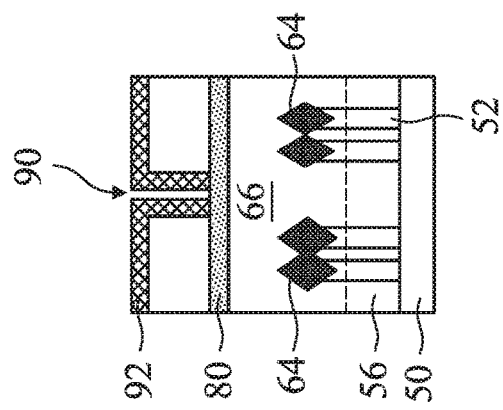
Figure 11B:
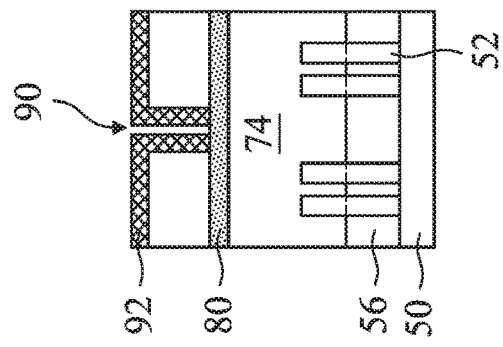
Figure 11A:
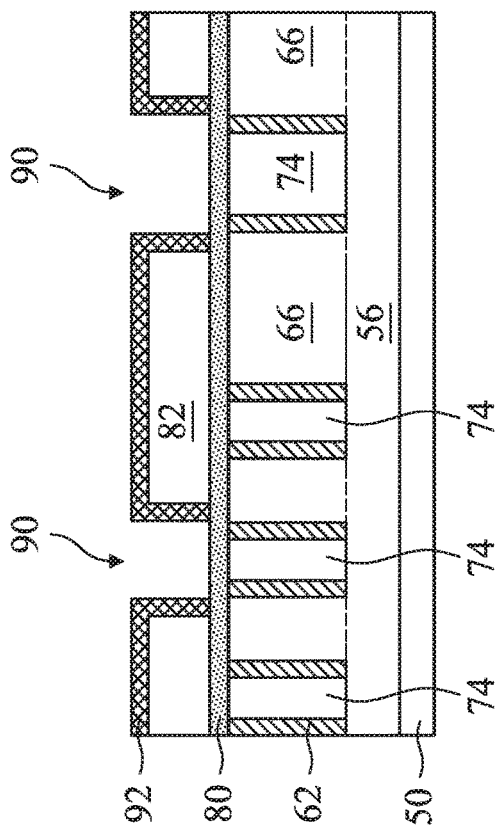

FIGS. 11A-11C illustrate an anisotropic etching process performed to remove portions of the blanket mask layer 92 lining the bottoms of the narrow openings 90. The etch stop layer 80 serves as an etch stop layer during the anisotropic etching process. As such, at least portions of the areas of the etch stop layer 80 overlying the one or more of the gate stacks 74 are re-exposed through the narrow openings 90. In the anisotropic etch, the horizontal portions of the blanket mask layer 92 lining the bottoms of the narrow openings 90 are removed whereas the remaining vertical portions on the sidewalls of the narrow openings 90 remain intact. As such, the vertical portions on the sidewalls of the narrow openings 90 form full rings having dimensions corresponding to the widths W90X and W90Y as illustrated in FIGS. 10A-10C and corresponding to the cut lines A-A', B-B', C-C' as illustrated in FIGS. 6A-6C. In some embodiments, the anisotropic etching process may be performed to remove the blanket mask layer 92 lining the bottoms of the narrow openings 90 using, for example, carbon-and-fluorine-containing gases such as CF4, CH2F2, CHF3, or the like. However, any suitable gases may be used for the anisotropic etching process.

FIGS. 12A-12C illustrate a cut-metal gate (CMG) etching process performed to remove the exposed portions of the areas of the etch stop layer 80 and to remove the one or more target portions of the gate stacks 74 (may be referred to as the cut metal gate region of the gate stacks 74), the associated gate spacers 62 and portions of the ILD 66 in order to form CMG trenches 94. This CMG etching process separates the one or more target portions of the gate stacks 74 into first metal gate sections 74a and second metal gate sections 74b, effectively "cutting" the first sections from the second sections as shown in FIG. 12B. The CMG etching process also separates the one or more target portions of the ILD 66 of the source/drain regions into first ILD sections 66a and second ILD sections 66b, effectively "cutting" the first sections from the second sections as shown in FIG. 12C. According to some embodiments, the CMG etching process comprises a dry etching using chlorine-containing or fluorine-containing gases, such as $Cl_2$, $NF_3$, $SiCl_4$, $BCl_3$, $O_2$, $N_2$, $H_2$, Ar, combinations thereof, or the like. However, any suitable dry etching gases may be used for the CMG etching process.

In some embodiments, the CMG trenches 94 are formed to a first depth P1 in a first portion of the CMG trenches 94 and are formed to a second depth P2 in a second portion of the CMG trenches 94. The first portions of the CMG trenches 94 are formed by removing the materials of the target portions of the gate stacks 74, removing the materials of the target portions of the gate spacers 62, and removing the materials of portions of the ILD 66 underlying the target portions of the gate stacks 74 and the target portions of the gate spacers 62. As such, the first portions of the CMG trenches 94 are formed to a first width W94X1 corresponding to the widths of the target gates of the gate stacks 74 and corresponding to the thicknesses of the gate spacers 62 in the ILD 66.

The second portions of the CMG trenches 94 are formed by removing the materials of the blanket mask layer 92 formed along the vertical sidewalls of the openings 88 through the hard mask layer 82 and by removing the materials of the portions of the ILD 66 underlying the blanket mask layer 92 formed along the vertical sidewalls of the openings 88 through the hard mask layer 82. As such, the second portions of the CMG trenches 94 are formed to a second width W94X2 corresponding to the widths of the openings W88X in the hard mask layer 82.

FIG. 12B, taken along the cut line B-B' near or at the center of the CMG trenches 94, illustrates the CMG trenches 94 are formed to the first depth P1 at which the target gate stacks 74 are fully separated (i.e., "cut") into their first sections 74a and second sections 74b. FIG. 12C, taken along the cut line C-C' near or at an area of the source/drain regions 64 of the CMG trenches 94, illustrates the CMG trenches 94 are formed to the second depth P2 at which a portion of the ILD 66 remains above the isolation regions 56 separating a portion of the fins 52 of adjacent devices.

As further illustrated in FIGS. 12A-12C, during the CMG etching process, a residual byproduct material 96 (e.g., a polymer) may be formed as a byproduct of reactions between the materials of the hard mask layer 82, the materials of the etch stop layer 80, the materials of the target gate stacks 74, the materials of the gate spacers 62, the materials of the ILD 66, and the reactant gases during the CMG etching process. For example, as illustrated in FIGS. 12A-12C, the residual byproduct material 96 may be formed over the hard mask layer 82 and along sidewalls of the CMG trenches 94.

Figure 13C:
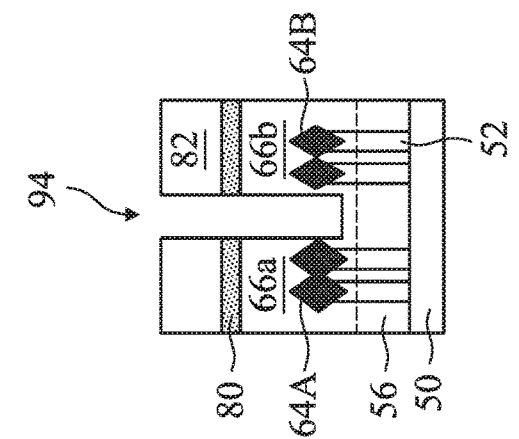
Figure 13B:
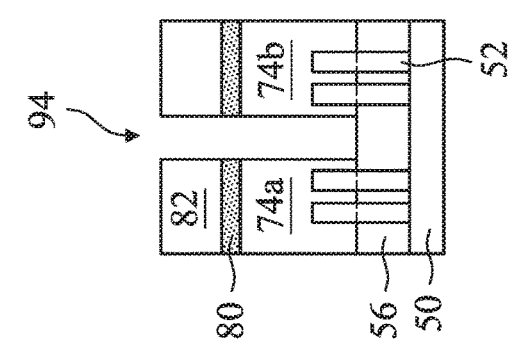
Figure 13A:
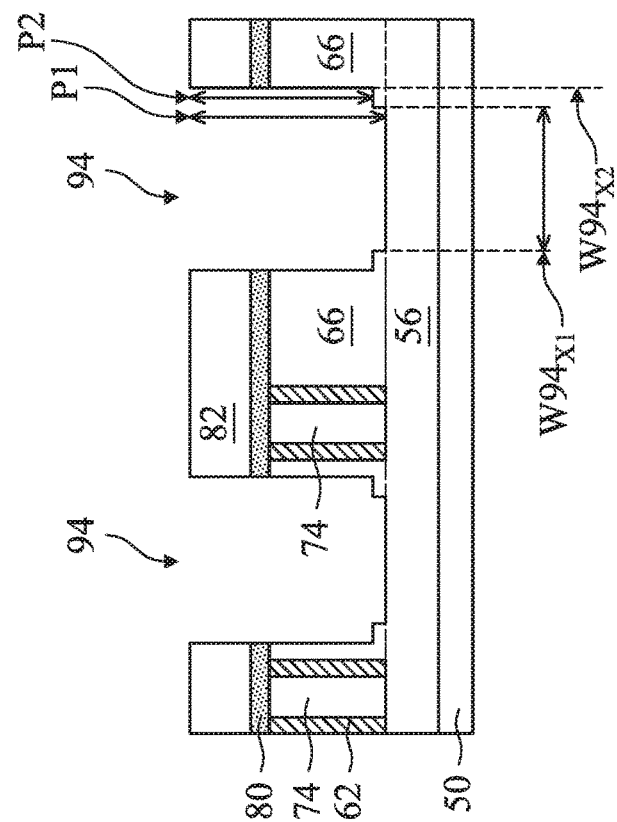

FIGS. 13A-13C illustrate a removal of the residual byproduct material 96. Once the CMG trenches 94 have been formed, a polymer removal process is performed to remove any residual polymer byproduct 96. For example, a non-plasma recipe with HF/NH3 gas may be used to remove the polymer material. The non-plasma recipe with HF/NH3 gas has low selectivity to metal and may be adjusted to have different selectivity to SiN by adjusting pressures and temperatures during removal of the polymer byproduct 96.

Once the CMG polymer byproduct 96 has been removed, a wet clean may be performed to ensure a clean surface of the CMG trenches 94 for further processing. According to some embodiments, a solution such as an SC-1 or SC-2 cleaning solution may be utilized for the wet clean process. Although, other solutions such as a mixture of $H_2SO_4$ and $H_2O_2$ (known as SPM), or a solution of hydrogen fluoride (HF), may also be utilized. However, any suitable solution or any suitable process may be used for the wet clean process and are fully intended to be included within the scope of the embodiments.

According to some embodiments, following the removal of the CMG polymer byproduct 96, the CMG trenches 94 may be formed to a first depth P1 of between about 50 nm and about 300 nm, and formed to a first width $W94_{X1}$ of between about 5 nm and about 500 nm, such as about 100 nm. The CMG trenches 94 may also be formed to a second depth P2 of between about 48 nm and about 298 nm, such as about 198 nm, and formed to a second width $W94_{X2}$ of between about 1 nm and about 10 nm, such as about 4 nm. However, any suitable depths and any suitable widths may be used for the first depth P1 and the second depth P2 of the CMG trenches 94 and any suitable widths may be used for the first width $W94_{X1}$ and the second width $W94_{X2}$ of the CMG trenches 94.

In addition, the CMG trenches 94 may have, for example, a U, V, or square shape when viewed in the cross-sections in FIGS. 13B and 13C and subsequent figures in these same cross sections. In the embodiment of FIGS. 13A-13C, the CMG trenches 94 have a square shape though other shapes are possible and are fully intended to be included within the scope of the embodiments (see, e.g., FIGS. 21A-22C).

Figure 14C:
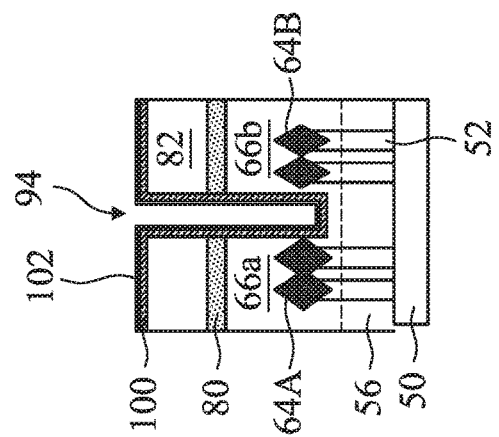
Figure 14B:
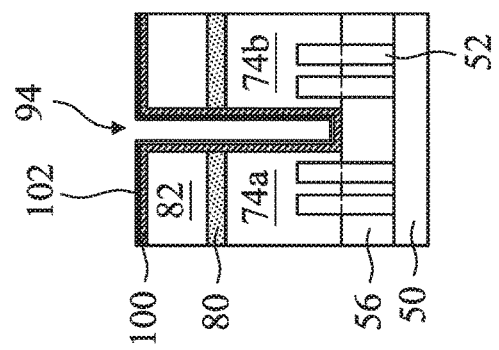
Figure 14A:
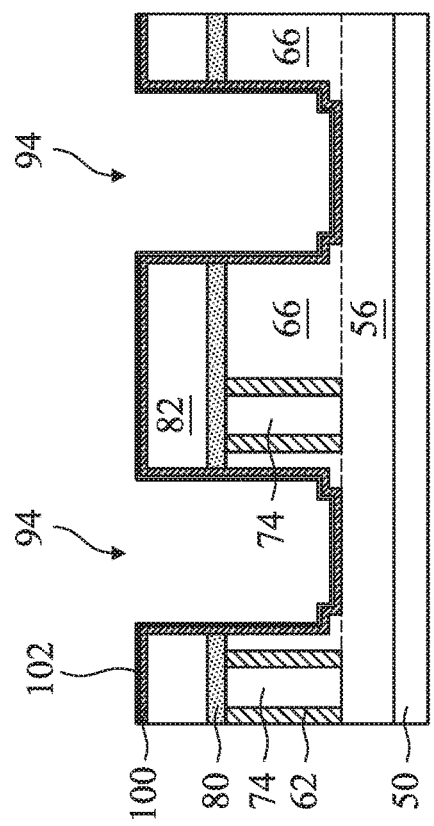

FIGS. 14A-14C illustrate a deposition of a barrier layer 100 over the structure of FIGS. 13A-13C. The barrier layer 100 can help to prevent the diffusion of the materials of CMG trenches 94 into the gate stacks 74 during subsequent processing. In some embodiments, the barrier layer 100 may comprise silicon nitride or the like. The barrier layer 100, may, for example, have a dielectric constant of in a range from about 6.5 to about 8. The barrier layer 100 may be deposited conformally using a deposition process such as ALD. The barrier layer 100 may be deposited to a thickness of about 1 nm to about 15 nm, such as about 5 nm, on each side of the CMG trenches 94.

In an embodiment, the barrier layer 100 is a silicon nitride layer deposited by a plasma enhanced atomic layer deposition (PEALD) process. In this embodiment, the PEALD process may be performed at a temperature in a range from 300° C. to about 600° C. Further, in this embodiment, the PEALD process forming the silicon nitride layer may include precursors of diiodosilane ($SiH_2I_2$) and $NH_3$.

FIGS. 14A-14C further illustrate an oxygen blocking layer 102 deposited conformally over the barrier layer 100. In an embodiment, the oxygen blocking layer 102 may be formed as an amorphous silicon material layer, or the like. In an example where the oxygen blocking layer 102 is a silicon layer 102, the silicon layer 102 may be deposited to a thickness in the range of about 2 Å to about 10 Å, such as about 5 Å, on each side of the CMG trenches 94. In the embodiment of FIGS. 14A-14C, the silicon layer 102 is deposited to a thickness of less than about 5 Å. The silicon layer 102 may be depositing conformally using a deposition process such as CVD. The silicon layer 102 acts as a barrier to oxidation of the underlying barrier layer 100 and the gate stacks 74. In some embodiments, the oxygen blocking layer 102 may be formed of other suitable materials that have low-k values and will act as a barrier to oxidation of the underlying barrier layer 100 and the gate stacks 74.

In an embodiment, the silicon layer 102 is deposited by CVD in a furnace at a temperature in a range from about 350 to about 450° C., at a pressure of about 1 to about 3 torr, with a disilane flow of about 0.3 to about 0.5 standard liters per minute (slm) and an N2 carrier flow of about 0 to 1 slm.

In another embodiment, the silicon layer 102 is deposited by PEALD in a single wafer chamber at a temperature in a range from about 300° C. to about 600° C., at a pressure of about 10 to about 20 torr, with precursor diiodosilane ($SiH_2I_2$) and a $N_2$ flow of about 200 to about 2000 slm, such as 800 slm, at a radio frequency of about 600 to about 800 watts, for about 0.2 to about 10 minutes, such as one minute.

In another embodiment, the silicon layer 102 is deposited by PEALD in a furnace at a temperature in a range from about 200° C. to about 500° C., at a pressure in a range from about 2 to about 5 torr, with precursor N-(diethylaminosilyl)-N-ethylethanamine ($C_8H_{22}N_2Si$) and an Ar flow rate in a range from about 0.5 to about 10 slm, such as 2 slm, at a radio frequency of about 15 to 100 watts, and with a time in a range from about 0.2 to about 10 minutes, such as one minute.

Following the deposition of the silicon layer 102, an oxidation process is performed to convert at least a portion of the silicon layer 102 into a silicon oxide layer. In an embodiment, the oxidation process includes an in-situ $O_2$ purge oxidation method. In an embodiment, the oxidation process includes an in-situ $O_2$ soak in a furnace, at a temperature in a range from about 350° C. to 450° C., at a pressure in a range from about 1 to about 3 torr, with a flow rate of $O_2$ in a range from about 0.2 to about 10 slm, and for a time in a range from about 2 mins to about 30 mins. In an embodiment wherein the silicon layer 102 is formed to have a thickness less than about 5 Å, the oxidation process fully converts the silicon layer 102 to be a silicon oxide layer.

In another embodiment the oxidation process is performed by breaking the vacuum to expose the silicon layer 102 to ambient atmosphere while the device is in queue for the next stage of processing described with respect to FIGS. 15A-15C below.

In some embodiments, after the oxidation process, the combined thickness of any remaining silicon layer 102 and the newly formed silicon oxide layer may have a thickness of about 0.4 nm to about 1.5 nm on each side of the CMG trenches 94.

Figure 15C:
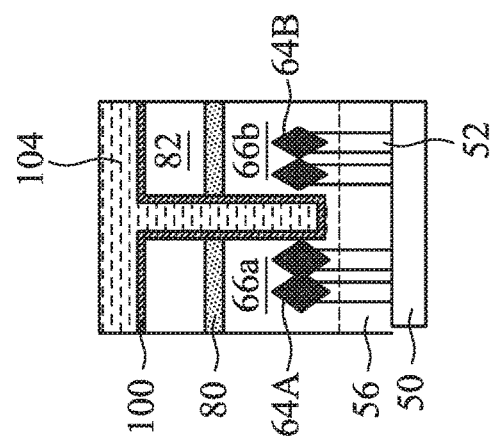
Figure 15B:
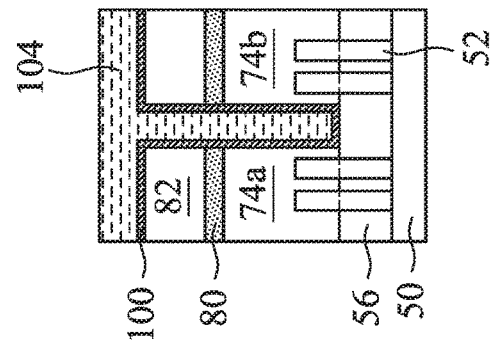
Figure 15A:
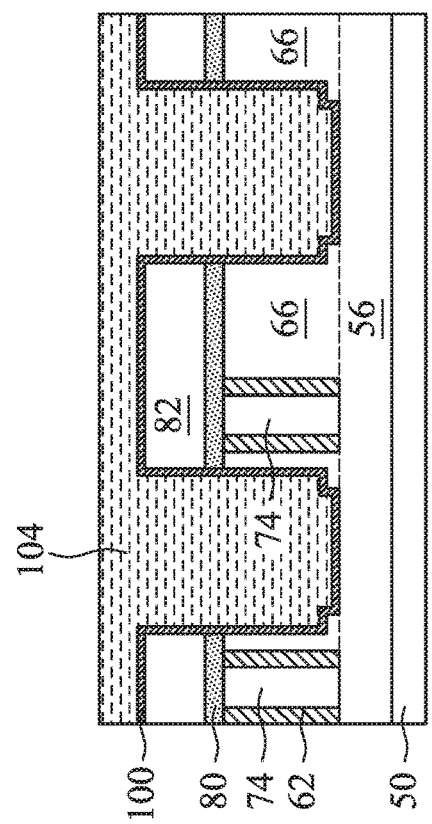

In FIGS. 15A-15C, a fill material 104 is deposited over the oxidized structure of FIGS. 14A-14C. The CMG trenches 94 may be filled with the fill material 104. In FIGS. 15A-15C and subsequent figures, the oxidized silicon layer is shown as being part of the fill material 104 as the material composition may be the same. The fill material 104 may be a dielectric material such as silicon oxide, silicon nitride, silicon oxycarbide, and/or silicon oxycarbonitride, in which carbon is between about 1% and 10% of the compound by weight and/or nitrogen is less than about 50% of the compound by weight, and may be represented by the formula $(Si)_{(1-y)}N_y$, $(SiO)_{(1-x)}C_x$, and/or $(SiO)_{(1-x-y)}C_xN_y$, wherein x=0.01-0.1 and y<0.5. The fill material 104 may be deposited using a deposition process such as PEALD, PECVD, ALD, CVD, or the like. In an embodiment, the fill material 104 is silicon oxide having a dielectric constant of about 3.5 to about 5. In an embodiment, the fill material 104 may be deposited to overfill the CMG trenches 94 to a level above the top surface of hard mask layer 82.

In an embodiment, the fill material is deposited by PEALD with precursors N-(diethylaminosilyl)-N-ethylethanamine ($C_8H_{22}N_2Si$) and $O_2$.

In an embodiment, each of the deposition of the barrier layer 100, the deposition of the silicon layer 102, and the oxidation of the silicon layer 102 can be performed in a single chamber. In other embodiments, the deposition of the barrier layer 100 is deposited in a separate chamber.

In an embodiment, each of the deposition of the silicon layer 102, the oxidation of the silicon layer 102, and the deposition of the fill material 104 can be performed in a single chamber. In this embodiment, the deposition of the barrier layer 100 is performed in a separate chamber.

In an embodiment, following deposition of the silicon layer 102 at a thickness of less than about 5 Å, oxidation of the silicon layer 102, and deposition of the fill material 104 of silicon oxide, all or substantially all of the silicon layer 102 is oxidized. Therefore, in this specific embodiment, the oxidized silicon layer 102 and the fill material 104 are both silicon oxide and are over the barrier layer 100 in the CMG trenches 94.

Figure 16C:
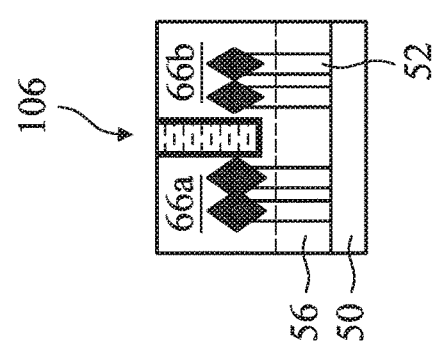
Figure 16B:
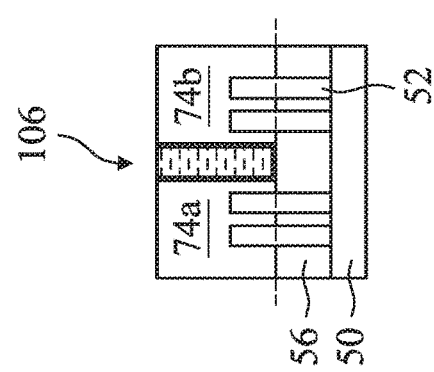
Figure 16A:
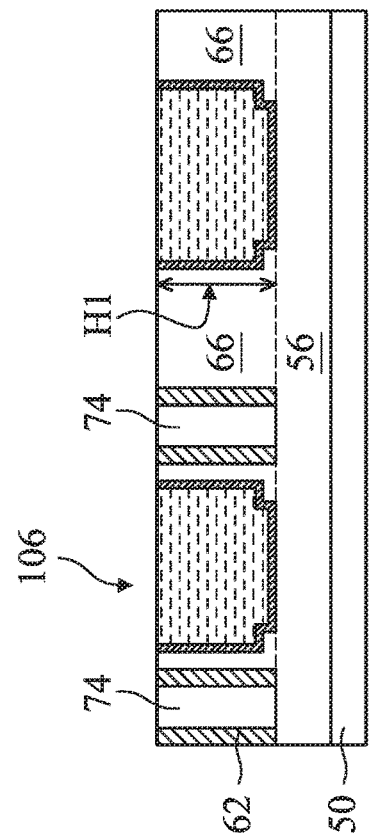

FIGS. 16A-16C illustrates a planarization of the fill material 104 which may be performed using, for example, a chemical mechanical (CMP) planarization process to remove the excess material of the fill material 104. The CMP planarization process may continue until the etch stop layer 80 has been fully removed and may continue until top surfaces of the fill material 104, the gate stacks 74, and the respective gate spacers 62 are exposed within a planar surface of the ILD 66. As such, CMG plugs 106 are formed from remaining material of the barrier layer 100, the silicon layer 102 (if any), and the fill material 104 disposed within the ILD 66. In some embodiments, once reduced, the heights of the gate stacks 74 and the heights of the CMG plugs 106 may be reduced to an overall first height H1 of between about 50 nm and about 120 nm, such as about 100 nm. However, any suitable heights may be used for the gate stacks 74 and the CMG plugs 106.

FIGS. 17A-19C illustrate intermediate stages in the manufacturing of FinFETs having a cut metal gate, in accordance with some other embodiments. The embodiment in FIGS. 17A-19C is similar to the embodiment illustrated in FIGS. 1-16C except that in this embodiment some of an oxygen blocking layer 202 remains unoxidized in the final structure. In this embodiment, the oxygen blocking layer 202 may be formed thicker than the oxygen blocking layer 102 of the previous embodiment such that the oxidation process does not oxidize the entirety of the oxygen blocking layer 202. Similar to the prior embodiment, as an example, the oxygen blocking layer 202 may be a silicon layer 202. Details regarding this embodiment that are similar to those for the previously described embodiment will not be repeated herein.

Figure 17C:
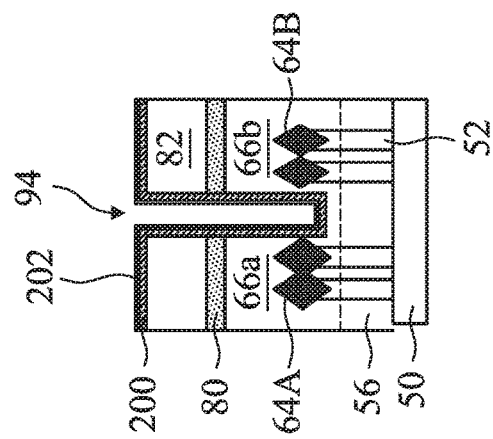
Figure 17B:
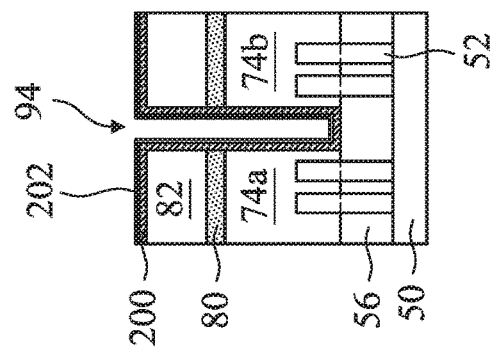
Figure 17A:
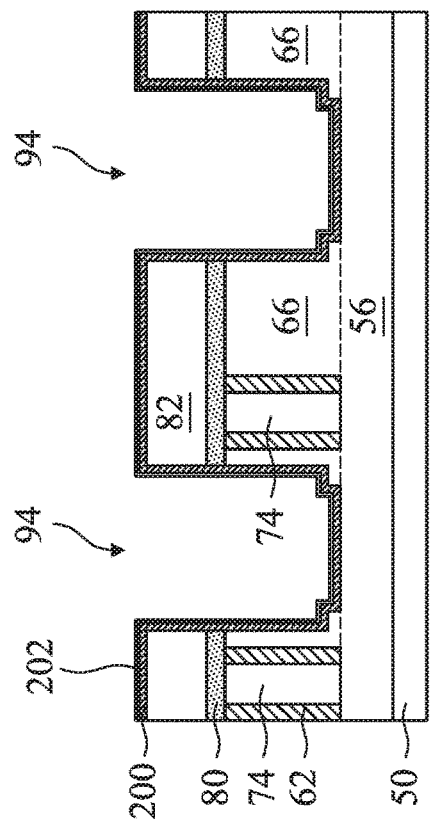

FIGS. 17A-17C illustrates an intermediate stage of processing similar to that described in FIGS. 14A-14C above and the description of forming this intermediate stage of processing is not repeated herein. As illustrated in FIGS. 17A-17C, following the removal of the residual byproduct material 96 in FIGS. 13A-13C, a barrier layer 200 is deposited over the structure of FIGS. 13A-13C. The materials and processes used to form the barrier layer 200 may be similar to the barrier layer 100 described above and the description is not repeated herein.

FIGS. 17A-17C further illustrate the silicon layer 202 deposited conformally over the barrier layer 200. The silicon layer 202 may be deposited to a thickness in the range of about 5 Å to about 10 Å, on each side of the CMG trenches 94. In the embodiment of FIGS. 17A-17C, the silicon layer 202 is deposited to a thickness of greater than or equal to about 5 Å. The materials and processes used to form the silicon layer 202 may be similar to the silicon layer 102 described above and the description is not repeated herein.

Following the deposition of the silicon layer 202, an oxidation process is performed to convert a portion of the silicon layer 202 into a silicon oxide layer while some of the silicon layer 202 remains. The oxidation process may be similar to the oxidation process described above in reference to FIGS. 14A-14C and the description is not repeated herein. Because the silicon layer 202 is formed thicker in this embodiment, the oxidation process does not convert the entirety of the silicon layer 202 into a silicon oxide layer and some of the silicon layer 202 remains.

In FIGS. 18A-18C, a fill material 204 is deposited over the oxidized structure of FIGS. 17A-17C. The materials and processes used to form the fill material 204 may be similar to the fill material 104 described above and the description is not repeated herein.

Figure 19C:
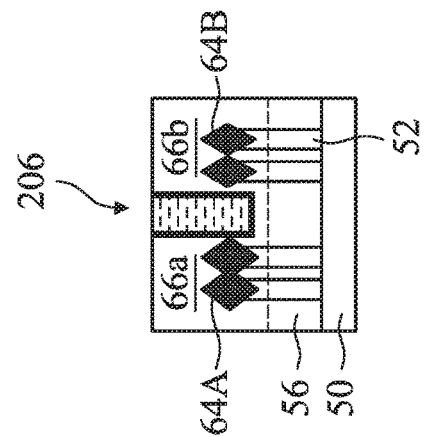
Figure 19B:
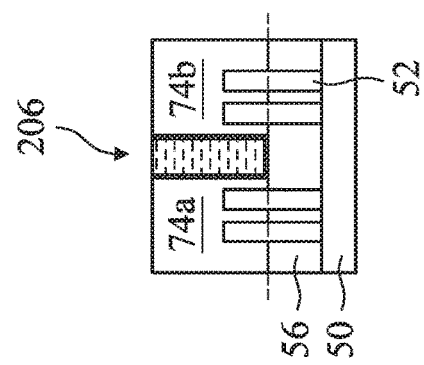
Figure 19A:
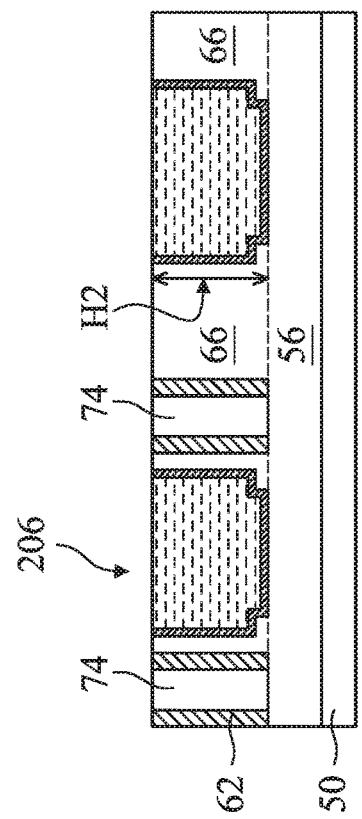

In FIGS. 19A-19C, the fill material 204 is planarized using, for example, CMP planarization process to remove the excess material of the fill material 204. The CMP planarization process may continue until the etch stop layer 80 has been fully removed and may continue until top surfaces of the fill material 204, the gate stacks 74, and the respective gate spacers 62 are exposed within a planar surface of the ILD 66. As such, CMG plugs 206 are formed from remaining material of the barrier layer 200, the silicon layer 202, and the fill material 204 disposed within the ILD 66. In some embodiments, once reduced, the heights of the gate stacks 74 and the heights of the CMG plugs 206 may be reduced to an overall height H2 of between about 50 nm and about 120 nm, such as about 100 nm. However, any suitable heights may be used for the gate stacks 74 and the CMG plugs 206.

Figure 20:
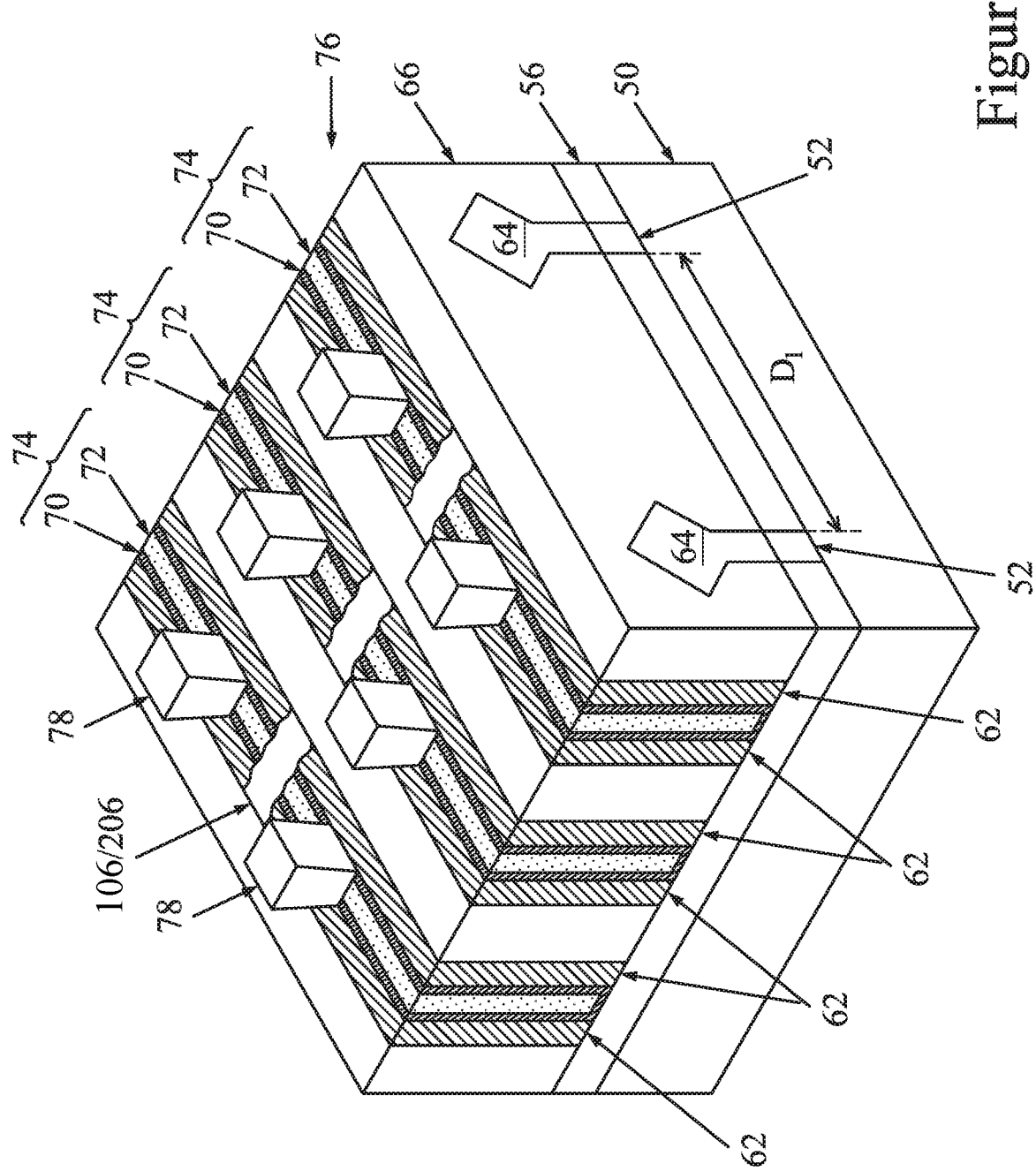
FIG. 20 illustrates a semiconductor device following additional stages in the manufacturing of FinFETs having a cut metal gate, in accordance with some embodiments.

FIG. 20 illustrates a semiconductor device following additional stages in the manufacturing of FinFETs having a cut metal gate.

Following formation of the cut metal gates, for example, at the stage following FIGS. 16A-16C or FIGS. 19A-19C, as illustrated in FIG. 20, a ILD 76 is deposited over the ILD 66. In some embodiments, the ILD 76 is a flowable film formed by a flowable CVD method. In some embodiments, the ILD 76 is formed of a dielectric material such as PSG, BSG, BPSG, USG, or the like, and may be deposited by any suitable method, such as CVD and PECVD.

Further, gate contacts 78 and source/drain contacts (not shown) are formed through the ILD 76 and the ILD 66. Openings for the source/drain contacts are formed through the ILD 66 and the ILD 76, and openings for the gate contacts 78 are formed through the ILD 76 (and optionally the gate mask, if formed). The gate contacts 78 (or source/drain contacts) may include a liner (such as a diffusion barrier layer, an adhesion layer, or the like) and a conductive material. The openings may be formed using acceptable photolithography and etching techniques. The liner and the conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. The conductive material may be formed by a deposition process such as CVD.

A planarization process, such as a CMP, may be performed to remove excess material from a surface of the ILD 76. The remaining liner and conductive material form the source/drain contacts and the gate contacts 78 in the openings. An anneal process may be performed to form a silicide at the interface between the epitaxial source/drain regions 64 and the source/drain contacts. The source/drain contacts are physically and electrically coupled to the epitaxial source/drain regions 64, and the gate contacts 78 are physically and electrically coupled to the gate electrodes 72. The source/drain contacts and the gate contacts 78 may be formed in different processes, or may be formed in the same process.

Figure 21C:
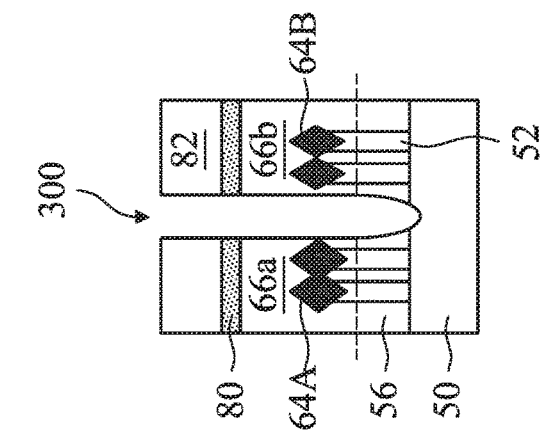
Figure 21B:
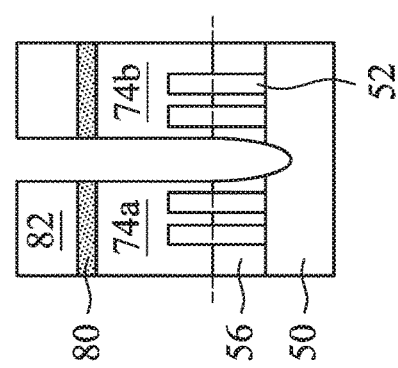
Figure 21A:
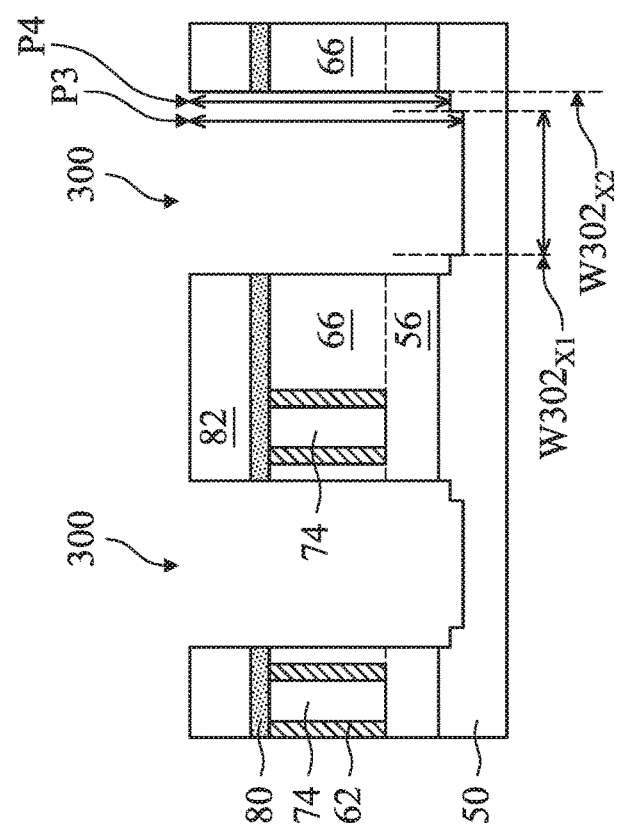

FIGS. 21A-22C illustrate intermediate stages in the manufacturing of FinFETs having a cut metal gate, in accordance with some other embodiments. The embodiment in in FIGS. 21A-22C is similar to the embodiments illustrated in FIGS. 1A-16C and FIGS. 17A-19C except that in this embodiment the CMG trenches are formed with a U shape. Also, in this embodiment, the trenches may be formed deeper to extend through the isolation regions 56 and partially into the substrate 50. Details regarding this embodiment that are similar to those for the previously described embodiments will not be repeated herein 002E FIGS. 21A-21C illustrates an intermediate stage of processing similar to that described in FIGS. 13A-13C above and the description of forming this intermediate stage of processing is not repeated herein. In FIGS. 21A-21C, a cut-metal gate (CMG) etching process is performed to remove the exposed portions of the areas of the etch stop layer 80 and to remove the one or more target portions of the gate stacks 74, the associated gate spacers 62 and portions of the ILD 66 in order to form CMG trenches 300. The materials and processes used to form the CMG trenches 300 may be similar to the CMG trenches 94 described above and the description is not repeated herein. In this embodiment, the etching time to form the CMG trenches 300 may be increased from the previous embodiments to have the CMG trenches 300 formed to greater depth.

As illustrated in FIGS. 21A-22C, following the removal of the residual byproduct material 96 in FIGS. 13A-13C, the CMG trenches 300 are formed to a depth P3 in a first portion of the CMG trenches 300 and are formed to a depth P4 in a second portion of the CMG trenches 300. The first portions of the CMG trenches 300 are formed by removing the materials of the target portions of the gate stacks 74, removing the materials of the target portions of the gate spacers 62, and removing the materials of portions of the ILD 66 underlying the target portions of the gate stacks 74 and the target portions of the gate spacers 62. As such, the first portions of the CMG trenches 300 are formed to a first width $W300_{X1}$ corresponding to the widths of the target gates of the gate stacks 74 and corresponding to the thicknesses of the gate spacers 62 in the ILD 66.

The second portions of the CMG trenches 300 are formed by removing the materials of the blanket mask layer 92 formed along the vertical sidewalls of the openings 88 through the hard mask layer 82 and by removing the materials of the portions of the ILD 66 underlying the blanket mask layer 92 formed along the vertical sidewalls of the openings 88 through the hard mask layer 82. As such, the second portions of the CMG trenches 300 are formed to a second width $W300_{X2}$ corresponding to the widths of the openings $W88_x$ in the hard mask layer 82 (see, e.g., FIGS. 9A-9C).

According to some embodiments, following the removal of the CMG polymer byproduct 96, the CMG trenches 300 may be formed to a first depth P3 of between about 150 nm and about 350 nm, and formed to a first width $W300_{X1}$ of between about 5 nm and about 25 nm, such as about 10 nm. The CMG trenches 300 may also be formed to a second depth P4 of between about 130 nm and about 330 nm, such as about 250 nm, and formed to a second width $W300_{X2}$ of between about 2 nm and about 20 nm, such as about 7 nm. However, any suitable depths and any suitable widths may be used for the first depth P3 and the second depth P4 of the CMG trenches 300 and any suitable widths may be used for the first width $W300_{X1}$ and the second width $W300_{X2}$ of the CMG trenches 300.

In addition, the CMG trenches 300 may have, for example, a U, V, or square shape when viewed in the cross-sections in FIGS. 21B and 21C and subsequent figures in these same cross sections. In the embodiment of FIGS. 21A-21C, the CMG trenches 300 have a U shape though other shapes are possible and are fully intended to be included within the scope of the embodiments.

FIGS. 22A-22C illustrates subsequent processing performed on the structure in FIGS. 21A-21C. The subsequent processing between FIGS. 21A-21C and 22A-22C is similar to the process illustrated and described above in FIGS. 14A-14C and 16A-16C or FIGS. 17A-17C and 19A-19C and the description is not repeated herein.

FIGS. 22A-22C illustrates a barrier layer 302 formed in the CMG trenches 300 and a fill material 304 formed on the barrier layer 302. Although a oxygen blocking layer (e.g., silicon layer 102 or 202) is not illustrated to be remaining in this embodiment, a oxygen blocking layer between the barrier layer 302 and the fill material 304 is possible and fully intended to be included within the scope of this embodiment. In this embodiment, because the CMG trenches 300 exposed the substrate 50, the barrier layer 302 physically contacts the substrate 50 in the trenches 300. The barrier layer 302 may be similar to the barrier layer 100 and the fill material 304 may be similar to the fill material 104. The materials and processes used to form barrier layer 100 and fill material 104 was described above and the description is not repeated herein.

Further, FIGS. 22A-22C further illustrates CMG plugs 306. The materials and processes used to form the CMG plugs 306 may be similar to the CMG plugs 106 described above and the description is not repeated herein. In this embodiment, once reduced, the heights of the gate stacks 74 and the heights of the CMG plugs 306 may be reduced to an overall first height H3 of between about 50 nm and about 150 nm. However, any suitable heights may be used for the gate stacks 74 and the CMG plugs 306.

Embodiments may achieve advantages. Embodiments include a cut metal gate (CMG) isolation structure formed in a CMG trench that improves the resistive-capacitive delay for the device and without degrading the threshold voltage of the device. In some embodiments, the CMG isolation structure includes multiple layers with a silicon nitride layer, a silicon layer, and a silicon oxide layer. In some embodiments, the silicon nitride layer acts as a barrier layer to prevent the diffusion of the materials of the gate stacks into the CMG trenches during subsequent processing. In some embodiments, the silicon layer acts as a barrier to oxidation of the underlying barrier layer and the gate stacks. Because the silicon layer protects the underlying layers from oxidation, a silicon oxide layer can be formed on the silicon layer, which reduces the dielectric constant of the CMG isolation structure. Further, by protecting the underlying layers (e.g., the gate stacks) from oxidation, the threshold voltages of the devices can be maintained while utilizing a CMG approach.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming an opening in a cut metal gate region of a metal gate structure of a semiconductor device;
conformally depositing a first dielectric layer in the opening;

conformally depositing a silicon layer over the first dielectric layer;
performing an oxidation process on the silicon layer to form a first silicon oxide layer, the first silicon oxide layer being on sidewalls and a bottom of the opening;
filling the opening with a second silicon oxide layer; and
performing a chemical mechanical polishing on the second silicon oxide layer and the first dielectric layer to form a cut metal gate plug, the chemical mechanical polishing exposing the metal gate structure of the semiconductor device.

2. The method of claim 1, wherein the first dielectric layer comprises silicon nitride.

3. The method of claim 1, wherein the performing the oxidation process on the silicon layer converts an entirety of the silicon layer to the first silicon oxide layer.

4. The method of claim 3, wherein the second silicon oxide layer is formed directly on the first silicon oxide layer.

5. The method of claim 1, wherein the performing the oxidation process on the silicon layer only converts a portion of the silicon layer to the first silicon oxide layer, and wherein a portion of the silicon layer remains unconverted.

6. The method of claim 5, wherein the remaining silicon layer separates the first dielectric layer from the first silicon oxide layer.

7. The method of claim 1, further comprising:
forming a first semiconductor fin over a substrate;
forming an isolation region surrounding a lower portion of the first semiconductor fin;
forming a dummy gate structure over a top surface and sidewalls of the first semiconductor fin and along a top surface of the isolation region;
forming source/drain regions on the first semiconductor fin;
forming an interlayer dielectric layer over the dummy gate structure, the source/drain regions, and the isolation region; and
replacing the dummy gate structure with the metal gate structure, the opening in the cut metal gate region of the metal gate structure extending through the interlayer dielectric layer.

8. The method of claim 7, wherein the opening in the cut metal gate region of the metal gate structure extends through the isolation region and into the substrate.

9. The method of claim 1, wherein the performing the oxidation process on the silicon layer comprises a plasma enhanced atomic layer deposition process.

10. A method, comprising:
forming a first semiconductor fin and a second semiconductor fin over a substrate, the second semiconductor fin being adjacent the first semiconductor fin;
forming an isolation region surrounding lower portions of the first semiconductor fin and the second semiconductor fin;
forming a dummy gate structure over top surfaces and sidewalls of the first semiconductor fin and the second semiconductor fin and along a top surface of the isolation region;
replacing the dummy gate structure with an active gate structure;
etching a first opening through the active gate structure, the first opening being between the first semiconductor fin and the second semiconductor fin, etching the first opening through the active gate structure comprising:
forming a first mask layer over the active gate structure;
patterning the first mask layer to form a second opening through the first mask layer over the active gate structure;
conformally forming a second mask layer over the patterned first mask layer, the second mask layer being on sidewalls and a bottom of the second opening through the first mask layer;
removing the second mask layer from the bottom of the second opening;
etching a first portion of the first opening using the first and second mask layers as a mask, the first portion of the first opening having a first depth;
etching a second portion of the first opening using the first mask layer as a mask, the second portion of the first opening having a second depth, the second depth being less than the first depth;
forming a barrier layer in the first opening and over the active gate structure;
forming an oxygen blocking layer over the barrier layer in the first opening and over the active gate structure;
performing an oxidation process on the oxygen blocking layer, the oxidation process forming a first oxide layer; and
forming a dielectric layer over the first oxide layer to fill the first opening.

11. The method of claim 10, wherein the dielectric layer is a silicon oxide layer.

12. The method of claim 10, further comprising:
growing epitaxial source/drain regions on the first semiconductor fin and the second semiconductor fin, the epitaxial source/drain regions being on opposing sides the dummy gate structure; and
forming an interlayer dielectric layer over the dummy gate structure, the epitaxial source/drain regions, and the isolation region, the first opening in the active gate structure extending through the interlayer dielectric layer.

13. The method of claim 12, wherein the first opening in the active gate structure extends through the isolation region and into the substrate.

14. The method of claim 10, wherein the performing the oxidation process on the oxygen blocking layer further comprises:
performing an $O_2$ soak process.

15. The method of claim 10, wherein the oxygen blocking layer is a silicon layer, and wherein forming the oxygen blocking layer over the barrier layer further comprises:
performing a plasma enhanced atomic layer deposition process including diiodosilane ($SiH_2I_2$).

16. The method of claim 10, wherein the oxygen blocking layer is a silicon layer, and wherein forming the oxygen blocking layer over the barrier layer further comprises:
performing a plasma enhanced atomic layer deposition process including N-(diethylaminosilyl)-N-ethylethanamine ($C_8H_{22}N_2Si$).

17. The method of claim 10, wherein the performing the oxidation process on the oxygen blocking layer converts an entirety of the oxygen blocking layer to the first oxide layer.

18. A method, comprising:
forming an opening in a cut metal gate region of a metal gate structure of a semiconductor device;
depositing a silicon nitride layer in the opening;
conformally depositing a silicon layer over the silicon nitride layer;
performing an oxidation process on the silicon layer to form a first silicon oxide layer;

filling the opening with a second silicon oxide layer, the second silicon oxide layer being formed directly on the first silicon oxide layer; and performing a chemical mechanical polishing on the second silicon oxide layer and the silicon nitride layer to form a cut metal gate plug, the chemical mechanical polishing exposing the metal gate structure of the semiconductor device.

19. The method of claim 18, wherein the performing the oxidation process on the silicon layer only converts a portion of the silicon layer to the first silicon oxide layer, and wherein a portion of the silicon layer remains unconverted.

20. The method of claim 18, further comprising:

forming a first semiconductor fin over a substrate;

forming an isolation region surrounding a lower portion of the first semiconductor fin;

forming a dummy gate structure over a top surface and sidewalls of the first semiconductor fin and along a top surface of the isolation region;

forming source/drain regions on the first semiconductor fin;

forming an interlayer dielectric layer over the dummy gate structure, the source/drain regions, and the isolation region; and replacing the dummy gate structure with the metal gate structure, the opening in the cut metal gate region of the metal gate structure extending through the interlayer dielectric layer.

* * * * *